US010623002B2

(12) United States Patent
Hattori

(10) Patent No.: US 10,623,002 B2
(45) Date of Patent: Apr. 14, 2020

(54) CIRCUIT DEVICE, OSCILLATOR, ELECTRONIC APPARATUS, MOVING OBJECT, AND METHOD OF MANUFACTURING OSCILLATOR

(71) Applicant: Seiko Epson Corporation, Tokyo (JP)

(72) Inventor: Masashi Hattori, Okaya (JP)

(73) Assignee: Seiko Epson Corporation (JP)

( * ) Notice: Subject to any disclaimer, the term of this patent is extended or adjusted under 35 U.S.C. 154(b) by 460 days.

(21) Appl. No.: 15/351,553

(22) Filed: Nov. 15, 2016

(65) Prior Publication Data

US 2017/0155393 A1    Jun. 1, 2017

(30) Foreign Application Priority Data

Nov. 30, 2015  (JP) ................. 2015-232844

(51) Int. Cl.

| G01J 5/00 | (2006.01) |
| G01K 7/00 | (2006.01) |
| G05D 23/20 | (2006.01) |
| G08B 13/18 | (2006.01) |
| G08B 27/00 | (2006.01) |
| H03L 1/02 | (2006.01) |
| H03B 5/32 | (2006.01) |
| H03L 1/04 | (2006.01) |
| H03L 7/091 | (2006.01) |

(Continued)

(52) U.S. Cl.
CPC ............... *H03L 1/026* (2013.01); *H03B 5/32* (2013.01); *H03L 1/04* (2013.01); *H03L 7/091* (2013.01); *H03L 7/093* (2013.01); *H03L 7/0992* (2013.01)

(58) Field of Classification Search
CPC ....... H03L 1/026; H03L 7/0992; H03L 7/093; H03L 1/04; H03L 7/091; H03B 5/32
USPC ...................................... 331/66, 176
See application file for complete search history.

(56) References Cited

U.S. PATENT DOCUMENTS 6,160,458 A *  12/2000  Cole ................. H03L 1/026
                                                                  331/158
6,373,294 B1 *  4/2002  Bentley ................. B82Y 10/00
                                                                  327/106

(Continued)

FOREIGN PATENT DOCUMENTS

JP    H10-093428 A    4/1998
JP    2010-147652 A   7/2010

*Primary Examiner* — Richard Tan
(74) *Attorney, Agent, or Firm* — Harness, Dickey & Pierce, P.L.C.

(57) ABSTRACT

A circuit device includes an A/D conversion section adapted to output temperature detection data, a temperature compensation section adapted to perform a temperature compensation process of the oscillation frequency based on the temperature detection data, and an oscillation signal generation circuit adapted to generate an oscillation signal using frequency control data from the temperature compensation section and a resonator. The frequency control data from the temperature compensation section is input to the oscillation signal generation circuit during a normal operation, and during a period other than the normal operation, data generated by a PLL circuit for comparing an input signal based on an output signal of the oscillation signal generation circuit and a reference signal with each other is input to the oscillation signal generation circuit.

17 Claims, 16 Drawing Sheets

(51) Int. Cl.
*H03L 7/093* (2006.01)
*H03L 7/099* (2006.01)

(56) References Cited

U.S. PATENT DOCUMENTS

| 7,015,762 | B1 * | 3/2006 | Nicholls | H03L 1/00 |
| | | | | 331/10 |
| 7,787,581 | B2 * | 8/2010 | Landmark | H03L 7/093 |
| | | | | 327/156 |
| 2014/0292423 | A1 * | 10/2014 | Isohata | H03L 1/025 |
| | | | | 331/70 |

* cited by examiner

CIRCUIT DEVICE, OSCILLATOR, ELECTRONIC APPARATUS, MOVING OBJECT, AND METHOD OF MANUFACTURING OSCILLATOR

BACKGROUND

1. Technical Field

The invention relates to a circuit device, an oscillator, an electronic apparatus, a moving object, and a method of manufacturing an oscillator.

2. Related Art

In the past, there has been known a temperature compensated oscillator called TCXO (temperature compensated crystal oscillator). As the TCXO, there can be cited an ATCXO standing for an analog-type temperature compensated oscillator, and a DTCXO standing for a digital-type temperature compensated oscillator. In these oscillators, in the temperature characteristic adjustment test in the product test, the temperature compensating data (e.g., coefficients of an approximation function for approximating the temperature characteristic of the oscillation frequency) is obtained based on the oscillation frequency and so on measured at each temperature, and the temperature compensating data is written to a nonvolatile memory of the oscillator.

The measurement method of the temperature compensating data in the DTCXO is disclosed in, for example, JP-A-2010-147652 (Document 1). In Document 1, there is disposed a switch for switching between a frequency control voltage from a D/A conversion circuit and an output voltage of a PLL circuit of a testing device to input to a voltage controlled oscillator, and the switch selects the output voltage of the PLL circuit during the test. To the PLL circuit, there are input the output signal of the voltage controlled oscillator and a reference signal, and thus a loop for locking the oscillation frequency of the voltage controlled oscillator on the normal oscillation frequency is configured. The data obtained by A/D converting the output voltage (i.e., the frequency control voltage to be input to the voltage controlled oscillator in the temperature compensation) of the PLL circuit when locking on the normal oscillation frequency and the temperature detection data are measured at each temperature, and the coefficients of the approximation function are calculated based on the measurement result.

The digital-type oscillator such as a DTCXO has an advantageous aspect in the frequency accuracy and so on compared to the analog-type oscillator such as an ATCXO. In the case in which the frequency accuracy has been improved, the test environment in which the frequency accuracy can be achieved becomes necessary. Therefore, in the oscillator such as a DTCXO, a test method with which the temperature compensating data such as the coefficients of the approximation function can accurately be determined is desired.

For example, in the method of Document 1, the coefficients of the approximation function are determined so that the input data (frequency control data output by the temperature compensation section) of the D/A conversion circuit coincides with the data obtained by A/D converting the output voltage of the PLL circuit when the frequency is locked on the normal oscillation frequency. However, in the loop of the PLL circuit, the output voltage of the PLL circuit is input to the voltage controlled oscillator, and therefore the coefficients of the approximation function should normally be determined so that the frequency control voltage output by the D/A conversion circuit coincides with the output voltage of the PLL circuit. Specifically, in Document 1, there is adopted the test method in which the difference between the conversion characteristic of the D/A conversion circuit and the conversion characteristic of the A/D conversion circuit is not reflected on the coefficients of the approximation function.

SUMMARY

An advantage of some aspects of the invention is to provide a circuit device, an oscillator, an electronic apparatus, a moving object, a method of manufacturing the oscillator, and so on capable of accurately determining the temperature compensating data such as the coefficients of the approximation function in the temperature characteristic adjustment test.

An aspect of the invention relates to a circuit device including an A/D conversion section adapted to perform an A/D conversion of a temperature detection voltage from a temperature sensor section to output temperature detection data, a temperature compensation section adapted to perform a temperature compensation process of an oscillation frequency based on the temperature detection data to output frequency control data of the oscillation frequency, and an oscillation signal generation circuit adapted to generate an oscillation signal with the oscillation frequency set by the frequency control data using the frequency control data from the temperature compensation section and a resonator, wherein the frequency control data from the temperature compensation section is input to the oscillation signal generation circuit during a normal operation, and during a period other than the normal operation, data generated by a PLL circuit adapted to compare an input signal based on an output signal of the oscillation signal generation circuit and a reference signal with each other is input to the oscillation signal generation circuit as oscillation signal generation circuit input data.

According to the aspect of the invention, during the period other than the normal operation, the data generated by the PLL circuit is input to the oscillation signal generation circuit, the oscillation signal with the oscillation frequency set by the data is generated, and the signal based on the oscillation signal is input to the PLL circuit. As described above, in this aspect of the invention, a loop using the PLL circuit is configured, and in the loop, the data is input from the PLL circuit to the oscillation signal generation circuit instead of a voltage. Thus, in the temperature characteristic adjustment test, the temperature compensating data such as coefficients of the approximation function can accurately be determined.

In the aspect of the invention, the circuit device may include an interface section. The oscillation signal generation circuit input data may be data input from the PLL circuit disposed outside the circuit device via the interface section.

According to the aspect of the invention with this configuration, during the period other than the normal operation, the data generated by the PLL circuit disposed outside the circuit device can be input to the oscillation signal generation circuit via the interface section.

In the aspect of the invention, the PLL circuit may be a testing PLL circuit disposed inside the circuit device.

According to the aspect of the invention with this configuration, during the period other than the normal operation, the data generated by the testing PLL circuit disposed inside the circuit device can be input to the oscillation signal generation circuit. Thus, since it becomes unnecessary to dispose the PLL circuit of the testing board, the design of the testing board can be simplified.

In the aspect of the invention, the oscillation signal generation circuit may include a D/A conversion section adapted to perform a D/A conversion of the frequency control data from the temperature compensation section, and an oscillation circuit adapted to generate the oscillation signal using an output voltage of the D/A conversion section and the resonator, the frequency control data from the temperature compensation section may be input to the D/A conversion section during the normal operation, and during the period other than the normal operation, the oscillation signal generation circuit input data may be input to the D/A conversion section.

According to the aspect of the invention with this configuration, during the normal operation, the D/A conversion is performed on the frequency control data from the temperature compensation section, and the oscillation signal is generated based on the voltage obtained by the D/A conversion. Thus, the temperature compensation of the oscillation frequency is realized. Further, during the period other than the normal operation, the D/A conversion is performed on the data generated by the PLL circuit, and the oscillation signal is generated based on the voltage obtained by the D/A conversion. Thus, the oscillation signal generation circuit input data when oscillating at the frequency corresponding to the reference signal can be obtained, and it becomes possible to obtain the data (e.g., the coefficient data of the approximation function) used for the temperature compensation based on the oscillation signal generation circuit input data.

In the aspect of the invention, the PLL circuit may include a phase comparator circuit adapted to compare the input signal based on the output signal of the oscillation signal generation circuit and the reference signal with each other, an A/D conversion circuit adapted to perform an A/D conversion on an output signal of the phase comparator circuit, and a digital filter adapted to perform a filter treatment on output data of the A/D conversion circuit to output the oscillation signal generation circuit input data.

By constituting the PLL circuit in such a manner as described above, it is possible for the PLL circuit to output the oscillation signal generation circuit input data as digital data. Since the digital data does not cause a voltage error, and is hard to be affected by the noise compared to an analog voltage, it becomes possible to accurately determine the data (e.g., the coefficient data of the approximation function) used for the temperature compensation.

In the aspect of the invention, during the normal operation, the temperature compensation section may output the frequency control data, which changes from first data corresponding to a first temperature to second data corresponding to a second temperature by k×LSB (k≥1), to the oscillation signal generation circuit in a case in which the temperature has changed from the first temperature to the second temperature, and during a test as the period other than the normal operation, the oscillation signal generation circuit input data may be input to the oscillation signal generation circuit.

In the case in which the temperature difference between the first temperature and the second temperature is large, the variation of the frequency control data also becomes large, and there is a possibility that the oscillation frequency changes rapidly (makes hopping). In this regard, according to the aspect of the invention with the configuration described above, the change is made from the first data corresponding to the first temperature to the second data corresponding to the second temperature by k×LSB (k≥1). Thus, the frequency hopping can be prevented.

In the aspect of the invention, the reference signal corresponding to a normal oscillation frequency may be input to the PLL circuit.

The temperature compensation is an operation of compensating the temperature characteristic of the oscillation frequency so that the oscillation frequency becomes constant at the normal oscillation frequency irrespective of the temperature. According to the aspect of the invention with the configuration described above, in the case in which the input signal to the PLL circuit locks on the reference signal, the oscillation frequency becomes the normal oscillation frequency. Therefore, by obtaining the output data of the PLL circuit in this case at each of the temperatures, there can be obtained the frequency control data for setting the oscillation frequency to the normal oscillation frequency at each of the temperatures. Thus, it is possible to obtain the data (e.g., the coefficient data of the approximation function) for accurately performing the temperature compensation.

In the aspect of the invention, a first reference signal corresponding to an upper limit of a frequency tolerance of a normal oscillation frequency, and a second reference signal corresponding to a lower limit of the frequency tolerance may be input to the PLL circuit, and the oscillation signal generation circuit input data corresponding to the first reference signal and the oscillation signal generation circuit input data corresponding to the second reference signal may be input to the oscillation signal generation circuit.

According to the aspect of the invention with this configuration, the oscillation signal generation circuit input data in the case in which the oscillation frequency becomes the upper limit of the frequency tolerance and the oscillation signal generation circuit input data in the case in which the oscillation frequency becomes the lower limit of the frequency tolerance can be obtained. By determining whether or not the frequency control data output by the temperature compensation section is between the two oscillation signal generation circuit input data described above, it becomes possible to test whether or not the oscillation frequency is within the frequency tolerance.

Another aspect of the invention relates to an oscillator including the circuit device according to any one of the configurations described above, and the resonator.

Still another aspect of the invention relates to an electronic apparatus including the circuit device according to any one of the configurations described above.

Yet another aspect of the invention relates to a moving object including the circuit device according to any one of the configurations described above.

Still yet another aspect of the invention relates to a method of manufacturing an oscillator including the steps of inputting an input signal based on an output signal of an oscillation signal generation circuit of the oscillator and a reference signal to a PLL circuit, inputting data generated by the PLL circuit to the oscillation signal generation circuit as oscillation signal generation circuit input data, obtaining temperature compensating data, which is used by the oscillator to perform a temperature compensation process of an oscillation frequency, based on temperature detection data from the oscillator and the oscillation signal generation circuit input data at each temperature, and writing the temperature compensating data into a storage section of the oscillator.

Further another aspect of the invention relates to a method of manufacturing an oscillator including the steps of inputting an input signal based on an output signal of an oscillation signal generation circuit of the oscillator and a first reference signal corresponding to an upper limit of a frequency tolerance of a normal oscillation frequency to a PLL circuit, inputting data generated by the PLL circuit to the oscillation signal generation circuit as first oscillation signal generation circuit input data, inputting the input signal based on the output signal of the oscillation signal generation circuit and a second reference signal corresponding to a lower limit of the frequency tolerance of the normal oscillation frequency to the PLL circuit, inputting data generated by the PLL circuit to the oscillation signal generation circuit as second oscillation signal generation circuit input data, comparing the first oscillation signal generation circuit input data, the second oscillation signal generation circuit input data, and frequency control data from a temperature compensation section of the oscillator with each other, and determining whether or not oscillation frequency of the oscillator satisfies the frequency tolerance of the normal oscillation frequency based on a result of the comparison.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be described in detail. It should be noted that the present embodiment described hereinafter does not unreasonably limit the content of the invention as set forth in the appended claims, and all of the constituents described in the present embodiment are not necessarily essential as means of the invention for solving the problems.

1. Adjustment and Test of Temperature Characteristic

The TCXO as a temperature compensated oscillator is used as a reference signal source of, for example, a communication terminal, and there is a demand for an improvement in frequency accuracy of the reference signal.

As a communication system between a communication terminal and abase station, there have been proposed a variety of systems. For example, in the TDD (time division duplex) system, each device transmits data in a time slot assigned to the device. Further, by setting guard time between the time slots (an uplink slot and a downlink slot), the time slots are prevented from overlapping each other. In the next-generation communication system, it has been proposed to perform the data communication with the TDD system using, for example, a single frequency band (e.g., 50 GHz).

However, in the case of adopting such a TDD system as described above, it is necessary to perform time synchronization in each device, and accurate time measurement of the absolute time is required. Although it is also possible to adopt a method of, for example, providing each device with an atomic clock (an atomic oscillator) as a reference signal source in order to realize such a demand, there arises a problem that an increase in cost of the device is incurred or the device grows in size.

Further, as the TCXO, there can be cited an ATCXO standing for an analog-type temperature compensated oscillator, and a DTCXO standing for a digital-type temperature compensated oscillator.

Figure 1:
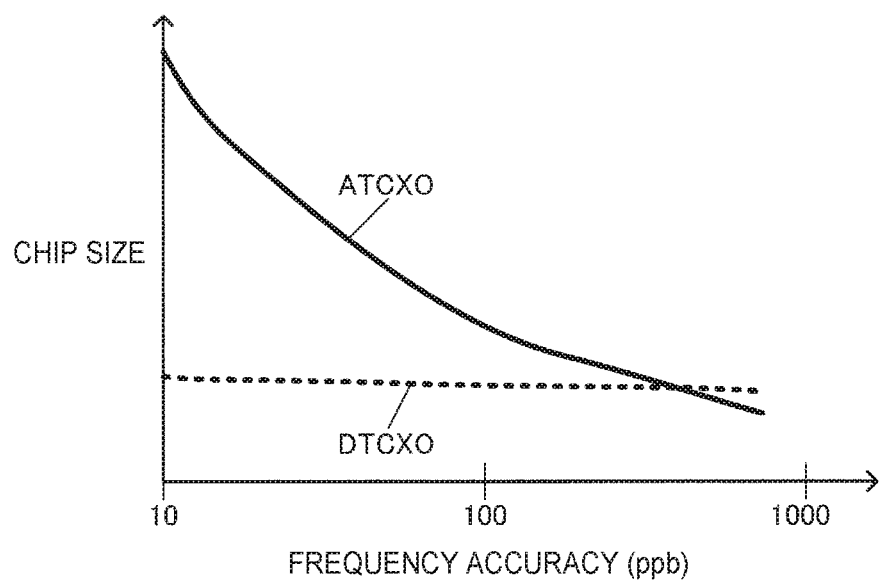
FIG. 1 is an explanatory diagram regarding advantages of a DTCXO.

Further, in the case of using the ATCXO as the reference signal source, if it is attempted to increase the frequency accuracy, the chip size of the circuit device grows as shown in FIG. 1, and it becomes difficult to realize reduction of cost and reduction of power consumption.

On the other hand, in the DTCXO, there is an advantage that the increase in frequency accuracy can be realized without significantly increasing the chip size of the circuit device as shown in FIG. 1.

Although the increase in frequency accuracy can be realized by adopting the DTCXO as described above, as the frequency accuracy is increased, there arises a necessity of testing the frequency accuracy with a higher accuracy, accordingly. In the TCXO, by controlling the frequency control voltage input to the voltage controlled oscillator (VCO) in accordance with the temperature, the temperature compensation of the oscillation frequency is achieved. On this occasion, the frequency control voltage is controlled in accordance with an approximation function as a function of temperature, and the frequency accuracy is determined in accordance with how accurately the approximation function approximates the actual temperature characteristic of the oscillation frequency. Therefore, in order to increase the frequency accuracy, how accurately the approximation function can be determined in the test is important.

As an example of the testing system, a related art example of the testing system in the DTCXO will be described using FIG. 2 and FIGS. 3A and 3B.

Figure 2:
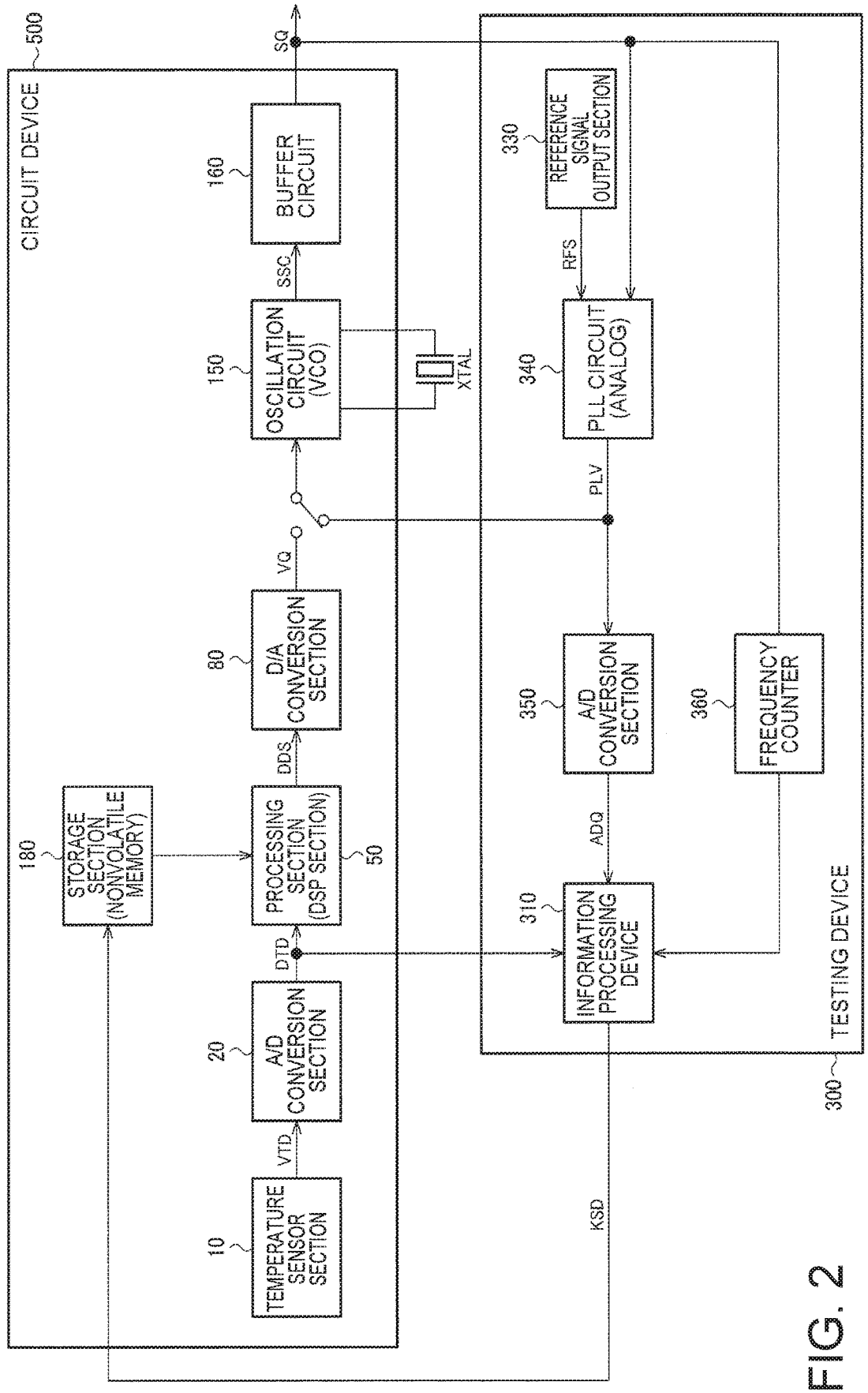
FIG. 2 is a diagram showing a comparative example of a circuit device, a testing device, and a testing system including the circuit device and the testing device.
Figure 3A:
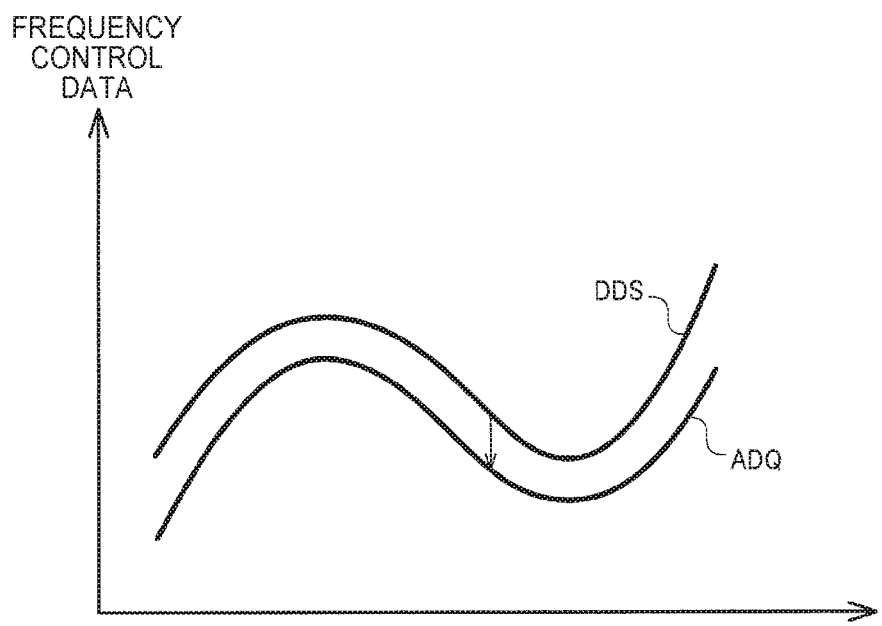
FIGS. 3A and 3B are explanatory diagrams of a coefficient determination process in the comparative example.

FIG. 2 shows a comparative example of a circuit device, a testing device, and a testing system including the circuit device and the testing device. The testing system shown in FIG. 2 includes an oscillator having a circuit device 500 and a resonator XTAL, and a testing device 300. The circuit device 500 includes a temperature sensor section 10, an A/D conversion section 20, a processing section 50, a storage section 180 (a nonvolatile memory), a D/A conversion section 80, an oscillation circuit 150, and a buffer circuit 160. The testing device 300 includes an information processing device 310 (e.g., a personal computer (PC)), a PLL circuit 340 (an analog PLL circuit), a reference signal output section 330, and a frequency counter 360.

During a normal operation in which the circuit device 500 is incorporated in the electronic apparatus or the like to perform a normal operation, the processing section 50 calculates frequency control data DDS corresponding to temperature detection data DTD in accordance with the approximation function, the D/A conversion section 80 performs the D/A conversion on the frequency control data DDS to output a frequency control voltage VQ, the oscillation circuit 150 oscillates the resonator XTAL with the oscillation frequency corresponding to the frequency control voltage VQ to output an oscillation signal SSC, and the buffer circuit 160 buffers the oscillation signal SSC and then outputs a signal SQ thus buffered.

On the other hand, during the test for determining the coefficients (coefficients of a polynomial such as a cubic function) of the approximation function, the PLL circuit 340 of the testing device 300 and the oscillation circuit 150 and the buffer circuit 160 of the circuit device 500 constitute a loop. The PLL circuit 340 outputs a voltage PLV (e.g., an output voltage of a loop filter) to the oscillation circuit 150 based on the signal SQ from the buffer circuit 160 and the reference signal RFS from the reference signal output section 330 to thereby make the oscillation frequency of the oscillation circuit 150 lock on the normal oscillation frequency.

Further, the A/D conversion section 350 performs the A/D conversion on the output voltage PLV of the PLL circuit 340 to output data ADQ, and the information processing device 310 records the data ADQ and the temperature detection data DTD. Since the measurement values at a plurality of temperatures are necessary in order to determine the coefficients of the approximation function, the acquisition of the data ADQ and the temperature detection data DTD is repeated at each of the temperatures. After the measurement at all of the temperatures is completed, the information processing device 310 calculates the coefficients of the approximation function based on the data ADQ and the temperature detection data DTD at each of the temperatures, and then writes the coefficients into the storage section 180. As shown in FIG. 3A, the coefficients are determined so that the frequency control data DDS output by the processing section 50 coincides with the data ADQ at each of the temperatures (in each of the temperature detection data DTD) having been used for the measurement.

After writing the coefficients into the storage section 180, the temperature is changed again, and the frequency of the output signal SQ of the oscillator is measured using the frequency counter 360 to determine whether or not the frequency of the output signal SQ is within the allowable range of the frequency deviation of the normal oscillation frequency.

In the testing system described above, since the oscillation frequency is set to the normal oscillation frequency in the state in which the PLL circuit 340 is locked, by determining the coefficients of the approximation function in such a manner as described above, it becomes possible to oscillate the oscillator with the normal oscillation frequency irrespective of the temperature.

However, in the testing system of the comparative example, what is controlled by the PLL circuit 340 is the voltage PLV to be input to the oscillator circuit 150. Specifically, to be precise, in the case in which the frequency control voltage VQ obtained by performing the D/A conversion on the frequency control data DDS coincides with the voltage PLV, the oscillation frequency becomes equal to the normal oscillation frequency. In the testing system of the comparative example, since the frequency control data DDS is made to coincide with the data ADQ (the data obtained by performing the A/D conversion on the output voltage PLV of the PLL circuit 340) to determine the coefficients of the approximation function as shown in FIG. 3A, there is a possibility that the difference degrades the accuracy of the temperature compensation.

Figure 3B:
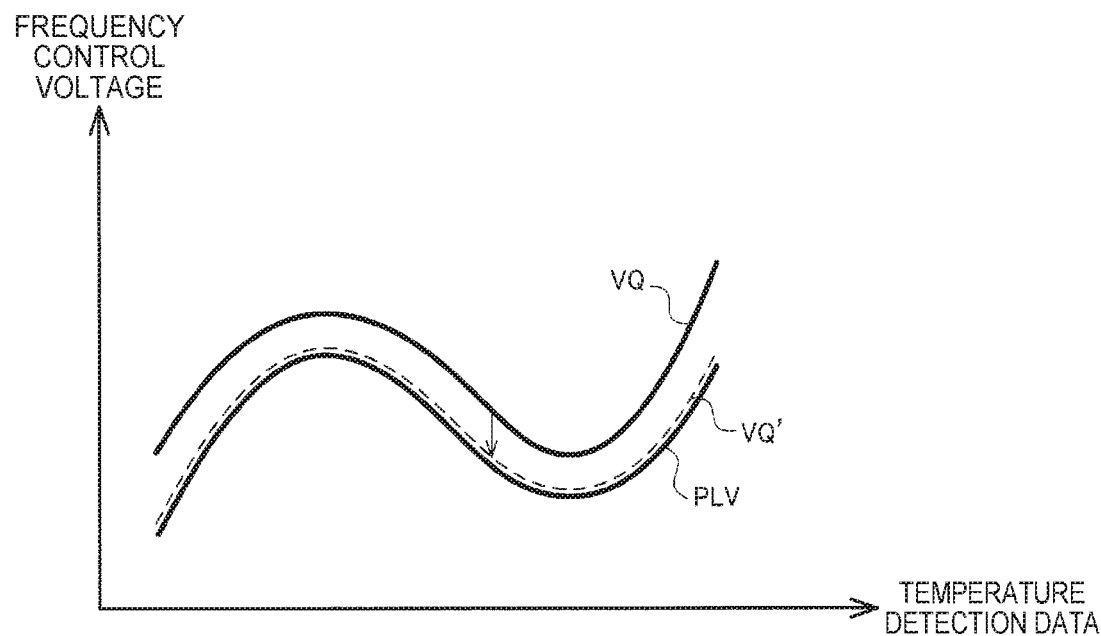

Specifically, in the case in which there exists a difference in conversion characteristics between the A/D conversion section 350 and the D/A conversion section 80, there is a possibility that the output voltage PLV of the PLL circuit 340 and the frequency control voltage VQ' obtained by performing the D/A conversion on the frequency control data DDS fail to coincide with each other as shown in FIG. 3B. FIG. 3B shows the fact that by determining the coefficients of the approximation function in the test, the frequency control voltage VQ is corrected into the frequency control voltage VQ'. As the difference in conversion characteristics between the A/D conversion section 350 and the D/A conversion section 80, there can be cited, for example, an error of linearity, and a difference (a difference in full-scale voltage) in voltage amplitude with respect to one LSB of the data. In particular, since the conversion characteristic of the D/A conversion section 80 in the circuit device 500 varies due to the manufacturing variation of the circuit device 500, it is difficult to find out the difference in conversion characteristic between the A/D conversion section 350 and the D/A conversion section 80 in advance.

If it is attempted to cancel out the difference in conversion characteristic using the test, it is necessary to determine once the coefficients to detect the error in oscillation frequency using the frequency counter 360, then determine the coefficients once again, and then test the result using the frequency counter 360. Since each of the processes is performed while varying the temperature, the test time becomes very long.

Further, since there is adopted the configuration of inputting the voltage PLV from the testing device 300 to the circuit device 500, there is a problem that it is easily affected by the error of the voltage PLV and the noise. As described above, since in the DTCXO, the frequency accuracy can be increased, the accuracy required to the voltage PLV also increases. For example, in the case of attempting to achieve higher frequency accuracy than the frequency accuracy of the present ATCXO, the voltage accuracy equal to or higher than 1 mV is required, and it results that a vary little error and noise affect the frequency accuracy. Further, since the TCXO outputs the clock signal with a high frequency, it is required to design the testing board so that the noise does not affect the voltage PLV. For example, there is a testing device of the type of mounting a plurality of oscillators on the testing board with sockets or the like, and performing the test while switching the oscillators. In such a testing device, although it is necessary to dispose a huge number of circuit components and signal lines on the testing board, it is difficult to take measures to the error of the voltage PLV and the noise in such an environment, and moreover, there is a possibility that the number of the sockets, which can be disposed on the testing board, decreases (the test efficiency decreases).

2. Configuration

Figure 4:
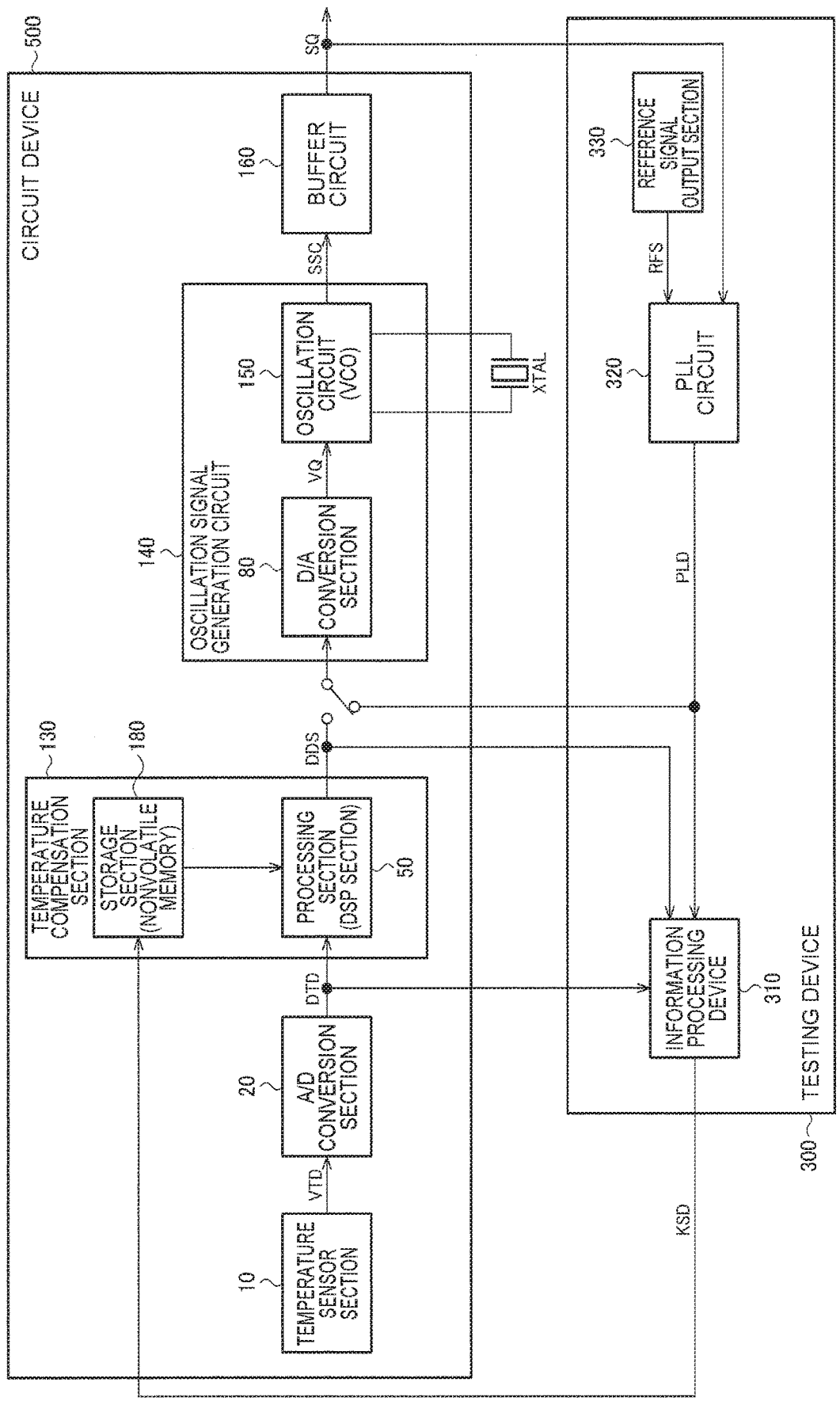
FIG. 4 is a diagram showing a configuration example of a circuit device, a testing device, and a testing system including the circuit device and the testing device according to an embodiment of the invention.

FIG. 4 shows a configuration example of the circuit device, the testing device, and the testing system including the circuit device and the testing device according to the present embodiment capable of solving the problem described above.

The circuit device 500 is a circuit device (a semiconductor chip) for realizing the digital-type oscillator such as a DTCXO or an OCXO (an oven controlled crystal oscillator). By, for example, housing the circuit device and a resonator XTAL in a package, the digital-type oscillator is realized.

The circuit device 500 includes an A/D conversion section 20, a temperature compensation section 130 (a temperature compensation circuit), and an oscillation signal generation circuit 140. Further, the circuit device can include a temperature sensor section 10 (a temperature sensor), and a buffer circuit 160. It should be noted that the configuration of the circuit device is not limited to the configuration shown in FIG. 1, but a variety of practical modifications such as elimination of some of the constituents (e.g., the temperature sensor section, the buffer circuit) or addition of other constituents are possible.

The testing system shown in FIG. 4 includes an oscillator having the circuit device 500 and the resonator XTAL, and the testing device 300. The testing device 300 includes the information processing device 310 (e.g., a personal computer (PC)), a PLL circuit 320 (a digital PLL circuit), the reference signal output section 330 (a reference signal output circuit).

Although in FIG. 4, there is illustrated a testing system constituted during the test, such a testing system is not constituted during the normal operation of the circuit device 500, but the oscillator including the circuit device 500 and the resonator XTAL is mounted on a board of an electronic apparatus or the like and operates as a part of the electronic apparatus. Firstly, the operation of the circuit device 500 during the normal operation will be described.

The resonator XTAL is a piezoelectric resonator such as a quartz crystal resonator. The resonator XTAL can also be an oven-type resonator (OCXO) disposed in a thermostatic oven. The resonator XTAL can also be a resonator (an electromechanical resonator, or an electrical resonance circuit). As the resonator XTAL, there can be adopted a piezoelectric resonator, a surface acoustic wave (SAW) resonator, a MEMS (micro electromechanical systems) resonator, and so on. As a substrate material of the resonator XTAL, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator XTAL, there can be used a device using a piezoelectric effect, or electrostatic drive using a coulomb force.

The temperature sensor section 10 outputs a temperature detection voltage VTD. Specifically, a temperature-dependent voltage varying in accordance with the temperature of the environment (the circuit device) is output as the temperature detection voltage VTD. For example, the temperature sensor can be configured using a forward voltage of a PN-junction as the temperature-dependent voltage.

The A/D conversion section 20 performs the A/D conversion of the temperature detection voltage VTD from the temperature sensor section 10 to output the temperature detection data DTD. For example, the digital temperature detection data DTD (A/D result data) corresponding to the A/D conversion result of the temperature detection voltage VTD is output. As the A/D conversion method of the A/D conversion section 20, there can be adopted, for example, a successive approximation method, a method similar to the successive approximation method, and so on. It should be noted that the A/D conversion method is not limited to such methods, but a variety of methods (e.g., a counting type, a parallel comparison type, or a serial-parallel type) can be adopted.

The temperature compensation section 130 performs the temperature compensation process of the oscillation frequency (the frequency of the oscillation signal) based on the temperature detection data DTD to output the frequency control data DDS of the oscillation frequency. Specifically, the temperature compensation section 130 includes a storage section 180 (memory) and a processing section 50 (a DSP (digital signal processing) section).

The storage section 180 stores coefficient data (data of the coefficients of the approximation function) for the temperature compensation process. The storage section 180 is, for example, a nonvolatile memory (e.g., an EEPROM).

The processing section 50 performs a variety of types of signal processing. For example, the processing section 50 performs the temperature compensation process described above. Specifically, the processing section 50 performs the temperature compensation process for making the oscillation frequency constant even in the case in which the temperature change occurs, based on the temperature detection data DTD (temperature-dependent data) varying in accordance with the temperature, the coefficient data (the data of the coefficients of the approximation function) for the temperature compensation process stored in the storage section 180, and so on. It is also possible for the processing section 50 to be realized by an ASIC circuit such as a gate array, or realized by a processor (e.g., a CPU or an MPU) and a program running on the processor.

It should be noted that the configuration of the temperature compensation section 130 is not limited to the configuration of performing the temperature compensation using the approximation function described above. For example, it is also possible for the temperature compensation section 130 to include a storage section for storing a table having the temperature detection data DTD and the frequency control data DDS so as to correspond to each other. In this case, the storage section outputs the frequency control data DDS corresponding to the temperature detection data DTD from the A/D conversion section 20 based on the table.

The oscillation signal generation circuit 140 generates the oscillation signal SSC. For example, the oscillation signal generation circuit 140 generates the oscillation signal SSC with the oscillation frequency, which is set by the frequency control data DDS, using the frequency control data DDS from the processing section 50 and the resonator XTAL. As an example, the oscillation signal generation circuit 140 oscillates the resonator XTAL at the oscillation frequency set by the frequency control data DDS to generate the oscillation signal SSC.

It should be noted that the oscillation signal generation circuit 140 can also be a circuit for generating the oscillation signal SSC with a direct digital synthesizer system. It is also possible to digitally generate the oscillation signal SSC with the oscillation frequency set by the frequency control data DDS using, for example, the oscillation signal of the resonator XTAL (an oscillation source of a fixed oscillation frequency) as a reference signal.

The oscillation signal generation circuit 140 can include the D/A conversion section 80 and the oscillation circuit 150. It should be noted that the oscillation signal generation circuit 140 is not limited to such a configuration, but a variety of modified implementations such as elimination of some of the constituents or addition of other constituents can be adopted.

The D/A conversion section 80 performs D/A conversion of the frequency control data DDS (output data of the temperature compensation section 130) from the temperature compensation section 130. The frequency control data DDS input to the D/A conversion section 80 is the frequency control data (a frequency control code) on which the temperature compensation process has been performed. As the D/A conversion method of the D/A conversion section 80, there can be adopted, for example, a resistance string type (a resistance division type). It should be noted that the D/A conversion method is not limited to the above, but there can also be adopted a variety of methods such as a resistance ladder type (e.g., an R-2R ladder type), a capacitance array type, and a pulse-width modulation type. Further, the D/A conversion section 80 can include a control circuit thereof, a modulation circuit, a filter circuit, and so on besides the D/A converter.

The oscillation circuit 150 generates the oscillation signal SSC using an output voltage VQ of the D/A conversion section 80 and the resonator XTAL. The oscillation circuit 150 is connected to the resonator XTAL via first and second resonator terminals (resonator pads). For example, the oscillation circuit 150 oscillates the resonator XTAL (e.g., a piezoelectric resonator, or a resonator) to thereby generate the oscillation signal SSC. Specifically, the oscillation circuit 150 oscillates the resonator XTAL at the oscillation frequency obtained by using the output voltage VQ of the D/A conversion section 80 as the frequency control voltage (the oscillation control voltage). For example, in the case in which the oscillation circuit 150 is a circuit (VCO) for controlling the oscillation of the resonator XTAL by voltage control, the oscillation circuit 150 can include a variable-capacitance capacitor (e.g., a varicap) having the capacitance value varying in accordance with the frequency control voltage. For example, one end of the variable-capacitance capacitor is connected to one end of the resonator XTAL. The capacitance value of the variable-capacitance capacitor is controlled by the output voltage VQ of the D/A conversion section 80, and thus, the capacitance of the one end of the resonator XTAL changes. Thus, it becomes possible to control the oscillation frequency of the oscillation signal SSC.

It should be noted that the oscillation circuit 150 can be realized by the direct digital synthesizer system as described above, and in this case, the oscillation frequency of the resonator XTAL becomes the reference frequency, which is different from the oscillation frequency of the oscillation signal SSC.

The buffer circuit 160 performs buffering of the oscillation signal SSC generated by the oscillation signal generation circuit 140 (the oscillation circuit 150), and then outputs a signal SQ obtained by the buffering. In other words, the buffer circuit 160 performs buffering for making it possible to sufficiently drive the external load. The signal SQ is, for example, a clipped sine wave signal. It should be noted that the signal SQ can also be a rectangular wave signal. Alternatively, the buffer circuit 160 can also be a circuit capable of outputting both of the clipped sine wave signal and the rectangular wave signal as the signal SQ.

Then, the operation of the circuit device 500 and the testing device 300 during the test will be described.

The circuit device 500 is provided with a selector for selecting the input signal of the oscillation signal generation circuit 140. As the oscillation signal generation circuit input data, the selector selects the output data DDS (the frequency control data) of the temperature compensation section 130 during the normal operation, and selects testing data PLD from the PLL circuit 320 of the testing device 300 during the test. The selector corresponds to, for example, an output section 70 of the processing section 50 described later with reference to FIG. 6. Alternatively, it is also possible to adopt a configuration in which the selector is disposed between the processing section 50 and the oscillation signal generation circuit 140.

The reference signal output section 330 of the testing device 300 outputs the reference signal RFS (the clock signal) with a frequency corresponding to the normal oscillation frequency. In other words, defining the multiplication ratio of the PLL circuit 320 as n (n is an integer or a decimal number equal to or greater than 1), and the normal oscillation frequency as FK, the frequency of the reference signal RFS is expressed as FK/n. The reference signal output section 330 can be formed of an oscillator capable of variably setting the frequency such as an oscillator incorporating a PLL circuit.

The PLL circuit 320 outputs the testing data PLD (the oscillation signal generation circuit input data) to the oscillation signal generation circuit 140 based on the reference signal RFS and the signal SQ from the buffer circuit 160, and makes the frequency of the oscillation signal SSC (the signal SQ) lock on the normal oscillation frequency. The configuration of the PLL circuit 320 will be described later with reference to FIG. 8.

It should be noted that although in FIG. 4, there is illustrated the case in which the PLL circuit 320 is included in the testing device 300, the configuration of the circuit device 500 and the testing device 300 is not limited to this case. As described later with reference to FIG. 7, it is also possible to adopt the configuration in which the circuit device 500 includes the PLL circuit 320, and the loop formed of the PLL circuit 320 is configured inside the circuit device 500 to perform the adjustment and the test of the temperature characteristic.

The information processing device 310 records the temperature detection data DTD (temperature detection data) from the A/D conversion section 20 of the circuit device 500 and the testing data PLD from the PLL circuit 320 of the testing device 300 at each of the temperatures. The testing data PLD is obtained when the PLL circuit 320 locks on the normal oscillation frequency. For example, a lock detection circuit is provided to the PLL circuit 320, and the testing data PLD is obtained after the lock detection circuit detects the lock-on state. Alternatively, it is also possible to obtain the testing data PLD after the sufficient time in which the lock-on can stably be achieved has elapsed. The temperature detection data DTD and the testing data PLD are obtained at temperature points no smaller in number than the degree of the approximation function.

Figure 5:
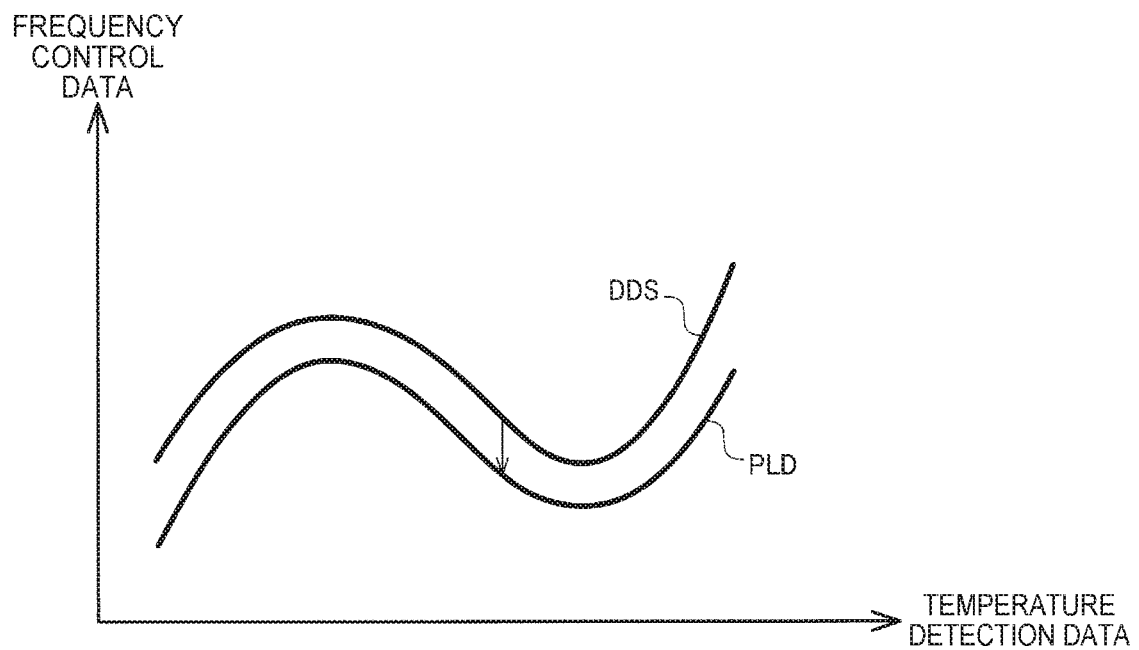
FIG. 5 is an explanatory diagram of a coefficient determination process in the embodiment.

The information processing device 310 obtains the coefficients of the approximation function based on the temperature detection data DTD and the testing data PLD at the temperature points (e.g., by fitting the approximation function). Specifically, the coefficients are determined so that in the case in which the temperature detection data DTD obtained at the temperature points is input to the temperature compensation section 130, the temperature compensation section 130 outputs the frequency control data DDS which is the same as the testing data PLD corresponding to the temperature detection data DTD. The information processing device 310 stores the coefficient data KSD to the storage section 180 of the circuit device 500. FIG. 5 is an explanatory diagram of the coefficient determination process. FIG. 5 shows the fact that by writing the coefficients thus determined into the storage section 180, the frequency control data DDS is corrected so as to coincide with the testing data PLD. In the present embodiment, by performing the adjustment and the test of the temperature characteristic described above, it becomes possible to determine the approximation function correctly approximating the temperature characteristic provided to the oscillation frequency.

After writing the coefficients into the storage section 180, whether or not the frequency deviation (a difference from the normal oscillation frequency) of the oscillation frequency is within the frequency tolerance is tested (a temperature characteristic test). In this test, the reference signal output section 330 sequentially outputs the reference signal RFS corresponding to the upper limit of the frequency tolerance, and the reference signal RFS corresponding to the lower limit thereof. Then, the information processing device 310 obtains the testing data PLD corresponding to the reference signal RFS, and the frequency control data DDS from the temperature compensation section 130 at each of the temperatures, and then determines pass or fail in the test based on these data. The details of the test will be described later with reference to FIG. 10 and so on. In the present embodiment, by performing such a temperature characteristic test, the frequency counter becomes unnecessary, and the circuit configuration of the testing device (the testing board) can be simplified.

In the embodiment described hereinabove, the circuit device 500 includes the A/D conversion section 20 for performing the A/D conversion of the temperature detection voltage VTD from the temperature sensor section 10 to output the temperature detection data DTD, the temperature compensation section 130 for performing the temperature compensation process of the oscillation frequency based on the temperature detection data DTD to output the frequency control data DDS of the oscillation frequency, and the oscillation signal generation circuit 140 for generating the oscillation signal SSC with the oscillation frequency set by the frequency control data DDS using the frequency control data DDS from the temperature compensation section 130 and the resonator XTAL. Further, during the normal operation, the frequency control data DDS from the temperature compensation section 130 is input to the oscillation signal generation circuit 140, and during the period other than the normal operation (during the test), the data PLD (the testing data) generated by the PLL circuit 320 for comparing the input signal SQ based on the output signal SSC (the oscillation signal) of the oscillation signal generation circuit 140 and the reference signal RFS with each other is input to the oscillation signal generation circuit 140 as the oscillation signal generation circuit input data.

According to the present embodiment, the data PLD generated by the PLL circuit 320 during the test is input to the oscillation signal generation circuit 140, and the coefficients of the approximation function are determined so that the frequency control data DDS coincides with the data PLD. Thus, it becomes possible to determine the approximation function correctly approximating the temperature characteristic provided to the oscillation frequency without being affected by the conversion characteristic of the D/A conversion section 80 and so on. Further, since only the digital data instead of a voltage are exchanged between the testing device 300 and the circuit device 500, it becomes difficult to be affected by the error and the noise, and thus, it is possible to cope with the increase in frequency accuracy by the DTCXO.

Here, the normal operation is the operation state in which the frequency control data DDS from the temperature compensation section 130 is input to the oscillation signal generation circuit 140, and the period other than the normal operation is the operation state in which the data PLD generated by the PLL circuit 320 is input to the oscillation signal generation circuit 140. The period other than the normal operation is specifically a period of apart of the entire test, and includes, for example, a period of adjusting and testing the temperature characteristic (the test shown in FIG. 9), and a period of testing the temperature characteristic (the test shown in FIG. 10). The entire test includes a variety of tests besides the above, and a test performed in the operation state in which the frequency data DDS from the temperature compensation section 130 is input to the oscillation signal generation circuit 140 is also included. In other words, the period in which such an operation state is not set corresponds to the period other than the normal operation period.

Further, in the present embodiment, for example, the circuit device 500 includes an interface section 170 as described later with reference to FIG. 6. Further, the oscillation signal generation circuit input data PLD is the data input from the PLL circuit 320 disposed outside the circuit device 500 via the interface section 170.

According to the present embodiment, during the test, the data PLD generated by the PLL circuit 320 disposed outside the circuit device 500 can be input to the oscillation signal generation circuit 140 via the interface section 170.

Further, in the present embodiment, as described later with reference to FIG. 7, for example, the PLL circuit 320 can also be a tensing PLL circuit disposed inside the circuit device 500.

According to the present embodiment, during the test, the data PLD generated by the PLL circuit 320 (a testing PLL circuit) disposed inside the circuit device 500 can be input to the oscillation signal generation circuit 140. Thus, since it becomes unnecessary to dispose the PLL circuit 320 on the testing board, and at the same time, it becomes unnecessary to exchange the signal SQ (the radio frequency signal) and the data PLD between the circuit device 500 and the PLL circuit 320, the design of the testing board can be simplified.

Further, in the present embodiment, the oscillation signal generation circuit 140 includes the D/A conversion section 80 for performing the D/A conversion of the frequency control data DDS from the temperature compensation section 130, and the oscillation circuit 150 for generating the oscillation signal SSC using the output voltage VQ of the D/A conversion section 80 and the resonator XTAL. Further, during the normal operation, the frequency control data DDS from the temperature compensation section 130 is input to the D/A conversion section 80. During the period other than the normal operation, the oscillation signal generation circuit input data PLD is input to the D/A conversion section 80.

According to the present embodiment, during the normal operation, the D/A conversion is performed on the frequency control data DDS from the temperature compensation section 130, and the oscillation signal SSC is generated based on the voltage VQ obtained by the D/A conversion. Thus, the temperature compensation of the oscillation frequency is realized. Further, during the test, the D/A conversion is performed on the data PLD generated by the PLL circuit 320, and the oscillation signal SSC is generated based on the voltage VQ obtained by the D/A conversion. Thus, the oscillation signal generation circuit input data PLD when oscillating at the normal oscillation frequency can be obtained, and the data (e.g., the coefficient data of the approximation function) used for the temperature compensation can be obtained based on the oscillation signal generation circuit input data PLD.

In the present embodiment, as described later with reference to FIG. 8, for example, the PLL circuit 320 includes a phase comparator circuit 324 for comparing an input signal BSS based on the output signal SSC of the oscillation signal generation circuit 140 and the reference signal RFS with each other, an A/D conversion circuit 326 for performing the A/D conversion on the output signal HKS of the phase comparator circuit 324, and a digital filter 328 for performing a filter process on output data AHS of the A/D conversion circuit 326 to output the oscillation signal generation circuit input data PLD.

According to the present embodiment, instead of the output voltage of the loop filter in an analog PLL circuit, the PLL circuit 320 outputs the oscillation signal generation circuit input data PLD as the digital data. Since the digital data does not cause the voltage error, and is hard to be affected by the noise compared to an analog voltage, the output data PLD of the PLL circuit 320 when oscillating at the normal oscillation frequency can accurately be measured. Thus, the coefficients of the approximation function can accurately be determined compared to the case of inputting the voltage from the PLL circuit 320 of the testing device 300 to the circuit device 500.

It should be noted that the PLL circuit 320 in the present embodiment is not the whole of the so-called PLL loop, but is a part thereof excluding at least a part (a digitally-controlled oscillation circuit controlled by the frequency control data DDS in the present embodiment) corresponding to the voltage-controlled oscillation circuit.

Further, in the present embodiment, during the normal operation, the temperature compensation section 130 outputs the frequency control data DDS, which changes from the first data corresponding to the first temperature to the second data corresponding to the second temperature by k×LSB (k≥1), to the oscillation signal generation circuit 140 in the case in which the temperature has changed from the first temperature to the second temperature. During the test, which is the period other than the normal operation, the oscillation signal generation circuit input data PLD is input to the oscillation signal generation circuit 140.

It is assumed that in a data output rate of the A/D conversion section 20, the temperature detection data corresponding to the first temperature is output at a certain output timing, and then the temperature detection data corresponding to the second temperature is output at the next output timing. In this case, if the temperature difference between the first temperature and the second temperature is large, the variation of the frequency control data DDS also becomes large, and there is a possibility that the oscillation frequency changes rapidly (makes hopping). Therefore, by making the change from the first data corresponding to the first temperature to the second data corresponding to the second temperature by k×LSB (k≥1), the frequency hopping can be prevented. It should be noted that the data output rate of the temperature compensation section 130 is higher than the data output rate of the A/D conversion section 20.

Further, in the present embodiment, the reference signal RFS corresponding to the normal oscillation frequency is input to the PLL circuit 320. Such a reference signal is input to the PLL circuit 320 in the adjustment and the test of the temperature characteristic.

The temperature compensation is an operation of compensating the temperature characteristic of the oscillation frequency so that the oscillation frequency becomes constant at the normal oscillation frequency irrespective of the temperature. According to the present embodiment, in the case in which the input signal to the PLL circuit 320 locks on the reference signal RFS, the oscillation frequency becomes the normal oscillation frequency. In other words, by obtaining the output data PLD of the PLL circuit 320 in this case at each of the temperatures, there can be obtained the frequency control data for setting the oscillation frequency to the normal oscillation frequency at each of the temperatures. Thus, it is possible to obtain the data (e.g., the coefficient data of the approximation function) for accurately performing the temperature compensation.

Further, in the present embodiment, to the PLL circuit 320, there are input the reference signal RFS (a first reference signal) corresponding to the upper limit of the frequency tolerance of the normal oscillation frequency, and the reference signal RFS (a second reference signal) corresponding to the lower limit of the frequency tolerance. Further, to the oscillation signal generation circuit 140, there are input the oscillation signal generation circuit input data PLD (PLDU in FIG. 10) corresponding to the first reference signal, and the oscillation signal generation circuit input data PLD (PLDD in FIG. 10) corresponding to the second reference signal. Such an operation is performed in the test of the temperature characteristic after the adjustment and the test of the temperature characteristic are completed.

According to the present embodiment, the oscillation signal generation circuit input data PLD in the case in which the oscillation frequency becomes the upper limit of the frequency tolerance and the oscillation signal generation circuit input data PLD in the case in which the oscillation frequency becomes the lower limit of the frequency tolerance can be measured. Thus, it is possible to test whether or not the oscillation frequency is within the frequency tolerance. Specifically, if the frequency control data DDS output by the temperature compensation section 130 is between the two oscillation signal generation circuit input data described above, it results that the oscillation frequency in the case of inputting the frequency control data DDS to the oscillation signal generation circuit 140 is within the frequency tolerance. By performing such determination of the magnitude relation, it is possible to test whether or not the oscillation frequency obtained by the temperature compensation is within the frequency tolerance.

Here, the frequency tolerance of the normal oscillation frequency denotes the range in which the frequency deviation (the frequency error) between the oscillation frequency and the normal oscillation frequency is allowable, and is, for example, the frequency tolerance in the specification of the circuit device 500 or the oscillator. The upper limit and the lower limit of the frequency tolerance used in the test are not required to be the same as the upper limit and the lower limit of the frequency tolerance in the specification, but can also be the upper limit and the lower limit of, for example, a narrower frequency range than the frequency tolerance in the specification.

Further, as the method of manufacturing the oscillator, the following test method for adjusting the temperature characteristic of the oscillation frequency can be performed.

Figure 9:
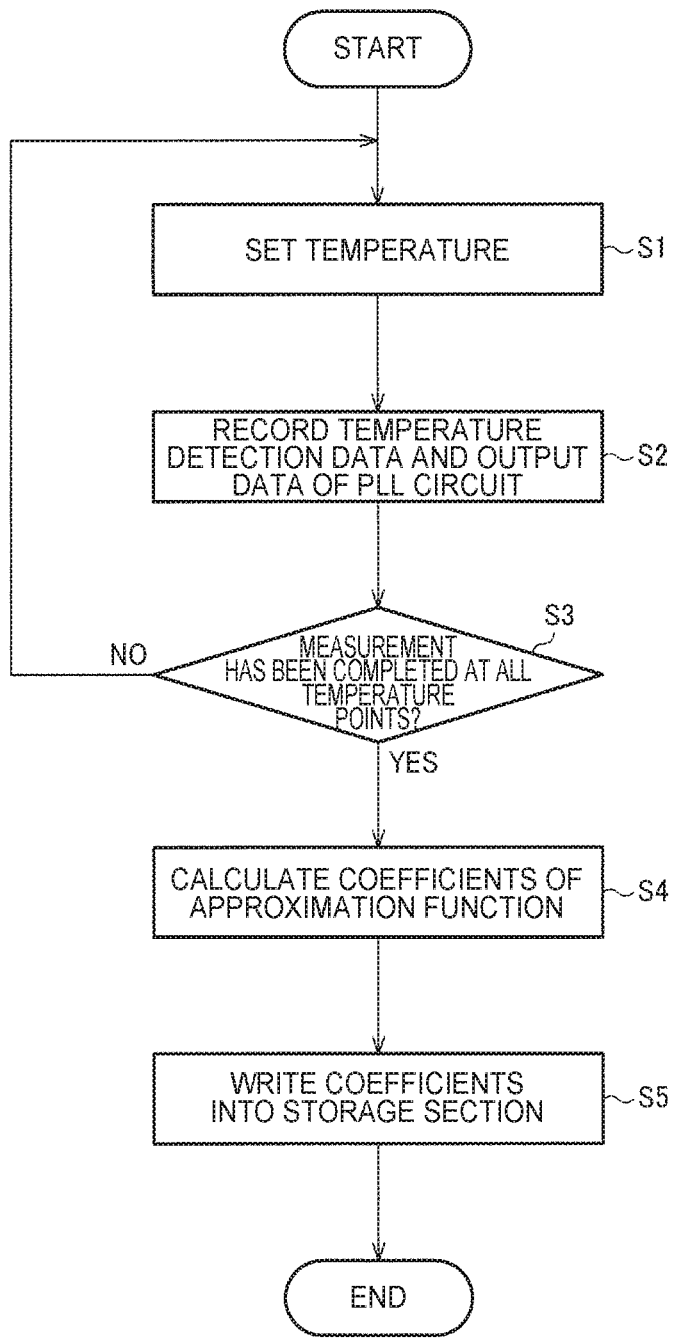
FIG. 9 is a flowchart of a method of adjusting the temperature characteristic of an oscillator.

Specifically, the input signal SQ based on the output signal SSC of the oscillation signal generation circuit 140 of the oscillator and the reference signal RFS are input to the PLL circuit 320 (step S2 in FIG. 9). The data PLD generated by the PLL circuit 320 is input to the oscillation signal generation circuit 140 as the oscillation signal generation circuit input data (step S2 in FIG. 9). The temperature compensating data (e.g., the coefficient data) for the oscillator to perform the temperature compensation process of the oscillation frequency is obtained (step S4 in FIG. 9) based on the temperature detection data DTD from the oscillator and the oscillation signal generation circuit input data PLD at each of the temperatures. The temperature compensating data is written (step S5 in FIG. 9) into the storage section 180 of the oscillator.

According to this test method, by inputting the oscillation signal generation circuit input data PLD generated by the PLL circuit 320 to the oscillation signal generation circuit 140, it becomes possible to accurately adjust the temperature characteristic of the digital-type oscillator such as the DTCXO.

Further, as the method of manufacturing the oscillator, the following method for testing the temperature characteristic of the oscillation frequency can be performed.

Figure 10:
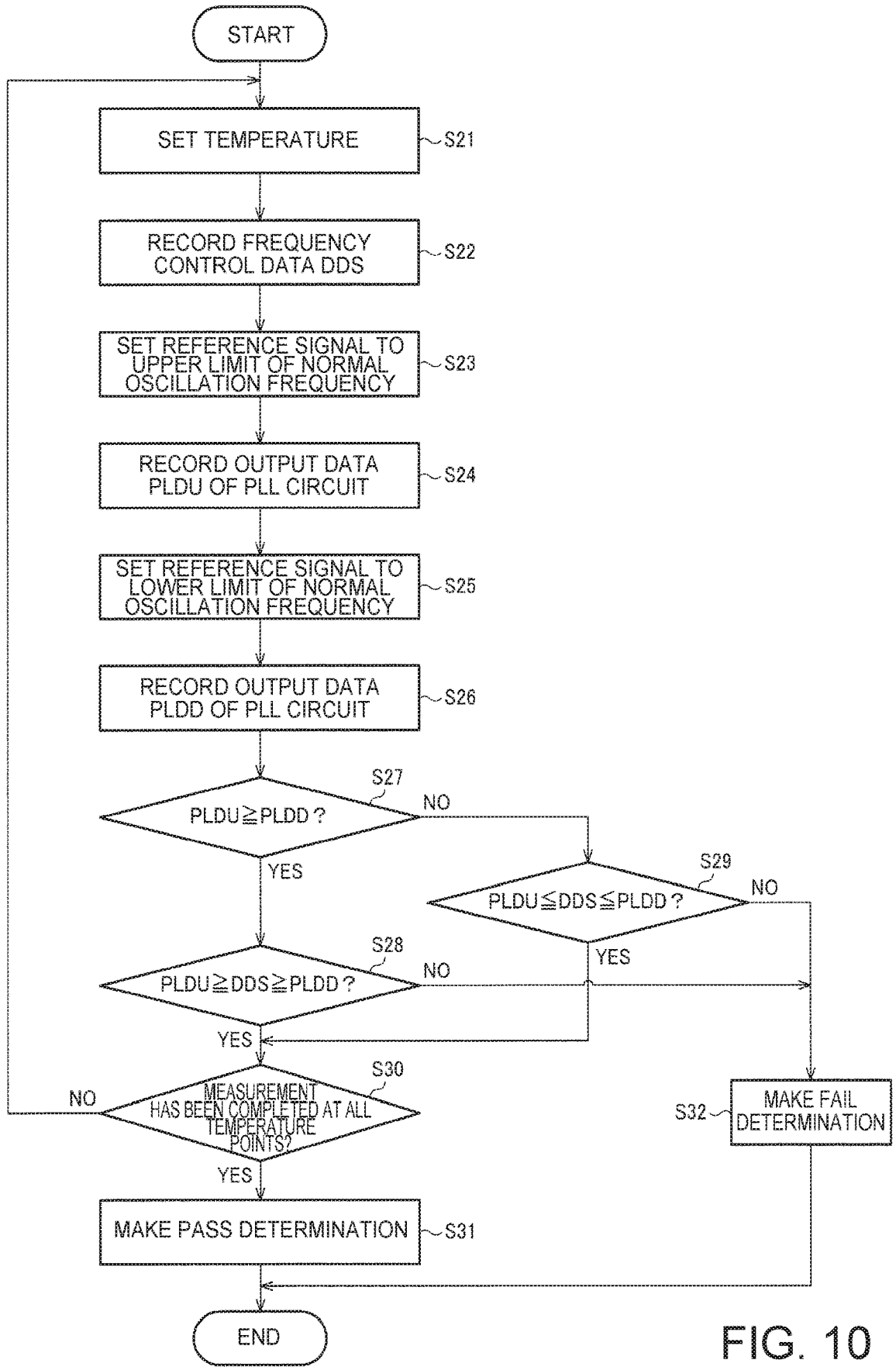
FIG. 10 is a flowchart of a method of testing the temperature characteristic of the oscillator.

Specifically, the input signal SQ based on the output signal SSC of the oscillation signal generation circuit 140 of the oscillator and the first reference signal corresponding to the upper limit of the frequency tolerance of the normal oscillation frequency are input to the PLL circuit 320 (steps S23, S24 in FIG. 10). Then the data PLD generated by the PLL circuit 320 is input to the oscillation signal generation circuit 140 as the first oscillation signal generation circuit input data PLDU (steps S23, S24 in FIG. 10). Then, the input signal SQ based on the output signal SSC of the oscillation signal generation circuit 140 and the second reference signal corresponding to the lower limit of the frequency tolerance of the normal oscillation frequency are input to the PLL circuit 320 (steps S25, S26 in FIG. 10). Then the data PLD generated by the PLL circuit 320 is input to the oscillation signal generation circuit 140 as the second oscillation signal generation circuit input data PLDD (steps S25, S26 in FIG. 10). Then, the first oscillation signal generation circuit input data PLDU, the second oscillation signal generation circuit input data PLDD, and the frequency control data DDS from the temperature compensation section 130 of the oscillator are compared with each other at each of the temperatures (steps S27 through S29 in FIG. 10). Then, based on the result of the comparison, whether or not the oscillation frequency of the oscillator satisfies the frequency tolerance of the normal oscillation frequency is determined (steps S31, S32 in FIG. 10).

According to this test method, by obtaining the oscillation signal generation circuit input data PLD generated by the PLL circuit 320, the temperature characteristic of the oscillation frequency can be tested. Therefore, it becomes possible to test the temperature characteristic of the oscillation frequency after writing the coefficients without measuring the oscillation frequency using the frequency counter. Since the measurement of the oscillation signal as a high-frequency signal, arrangement of the signal lines, and measures against the influence of the noise due to the high-frequency signal become unnecessary, the testing device 300 can be simplified.

3. First and Second Detailed Configurations of Circuit Device

Figure 6:
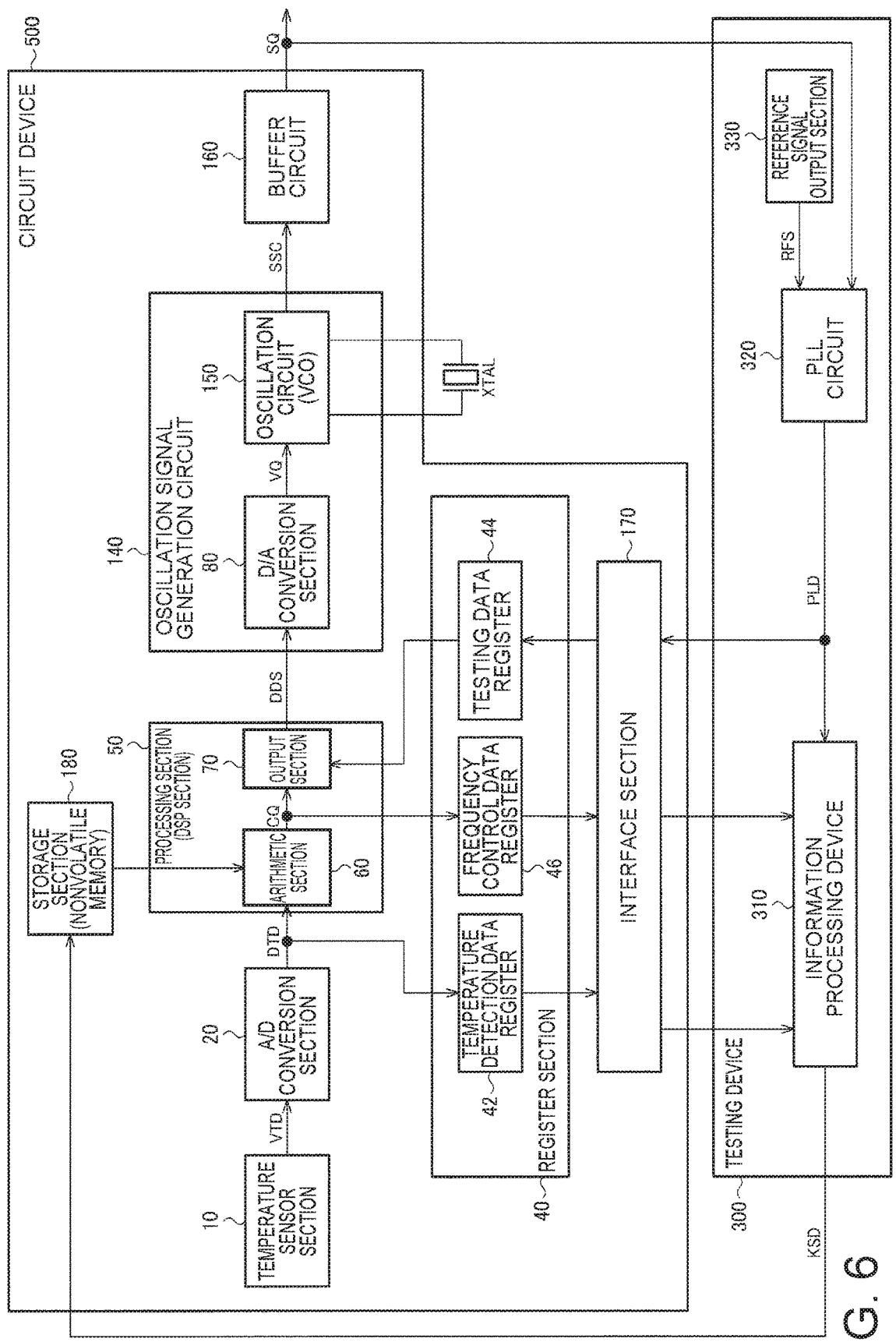
FIG. 6 is a diagram showing a first detailed configuration example of the circuit device, the testing device, and the testing system including the circuit device and the testing device.

FIG. 6 shows a first detailed configuration example of the circuit device, the testing device, and the testing system including the circuit device and the testing device. The circuit device 500 shown in FIG. 6 includes a register section 40 (a register), the interface section 170 (an interface circuit), the storage section 180, the processing section 50, the oscillation signal generation circuit 140, and the buffer circuit 160. The processing section 50 includes an arithmetic section 60 and an output section 70. The testing device 300 includes an information processing device 310, the PLL circuit 320, and the reference signal output section 330.

The interface section 170 inputs and outputs digital data between the testing device 300 and the circuit device 500. The interface section 170 is, for example, the I$^2$C communication interface section, or a 3-line or 4-line serial communication interface section. For example, as input/output terminals for the communication, dedicated terminals are provided to the circuit device 500. Alternatively, it is also possible to use input/output terminals for other signals also as the input/output terminals for the communication. In this case, the dual-purpose terminals function as the input/output terminals for the communication in the case in which the circuit device 500 is set to the test mode (e.g., by setting of a register), and function as the input/output terminals for other signals in the case in which the circuit device 500 is set to the normal operation mode.

The register section 40 includes a temperature detection data register 42, a testing data register 44, and a frequency control data register 46. The temperature detection data register 42 stores the temperature detection data DTD output by the A/D conversion section 20, and the information processing device 310 reads the temperature detection data DTD from the temperature detection data register 42 via the interface section 170. The testing data register 44 stores the testing data PLD input from the PLL circuit 320 via the interface section 170. During the test, the output section 70 outputs the testing data PLD stored in the testing data register 44 to the oscillation signal generation circuit 140 as the frequency control data DDS. The frequency control data register 46 stores the operation result data CQ output by the arithmetic section 60 as the frequency control data, and the information processing device 310 reads the operation result data CQ from the frequency control data register 46 via the interface section 170.

The arithmetic section 60 performs the temperature compensation process based on the temperature detection data DTD and the coefficient data of the approximation function, and then outputs the operation result data CQ. During the normal operation, the output section 70 outputs the frequency control data DDS based on the operation result data CQ. For example, in the case in which the operation result data CQ has changed from the first data corresponding the first temperature to the second data corresponding to the second temperature, the output section 70 performs an output process of the frequency control data DDS, which changes from the first data to the second data by k×LSB. Due to the process described above, it is possible to suppress the rapid change of the frequency control data DDS to prevent hopping of the oscillation frequency. Since the frequency control data which can directly be obtained by the temperature compensation process is the operation result data CQ, the operation result data CQ is output to the information processing device 310. During the test, the output section 70 outputs the testing data PLD as the frequency control data DDS as described above. As described above, the output section 70 corresponds to a selector for selecting either one of the operation result data CQ and the testing data PLD. It should be noted that the details of the arithmetic section 60 and the output section 70 will be described later with reference to FIG. 11 through FIG. 13B.

Figure 7:
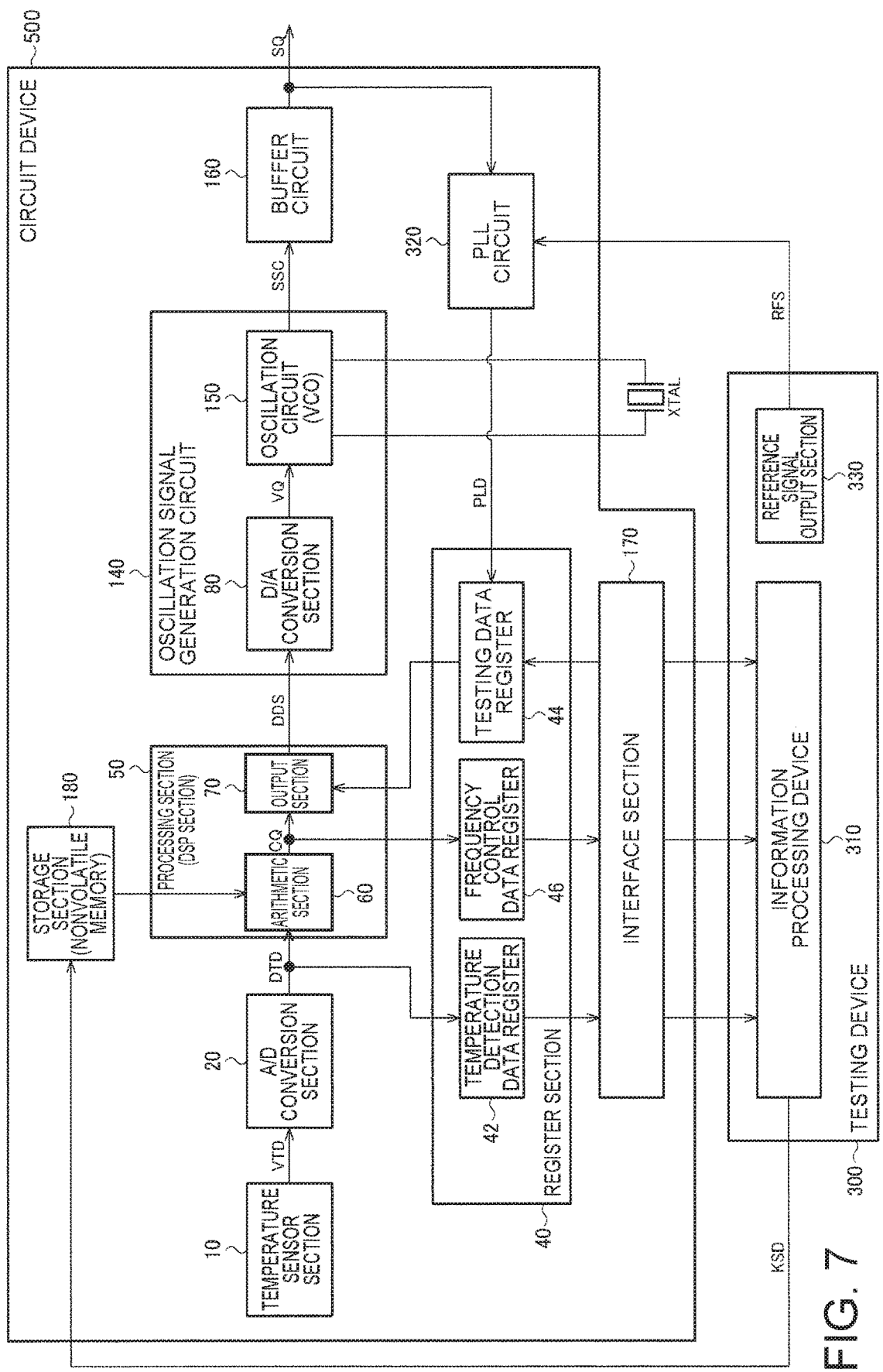
FIG. 7 is a diagram showing a second detailed configuration example of the circuit device, the testing device, and the testing system including the circuit device and the testing device.

FIG. 7 shows a second detailed configuration example of the circuit device, the testing device, and the testing system including the circuit device and the testing device. The circuit device 500 shown in FIG. 7 includes the PLL circuit 320 (the testing PLL circuit), the register section 40, the interface section 170, the storage section 180, the processing section 50, the oscillation signal generation circuit 140, and the buffer circuit 160. The processing section 50 includes the arithmetic section 60 and the output section 70. The testing device 300 includes the information processing device 310, and the reference signal output section 330.

In FIG. 7, the PLL circuit 320 used for the adjustment and the test of the temperature characteristic is incorporated in the circuit device 500.

Specifically, the PLL circuit 320 is supplied with the reference signal RFS from the reference signal output section 330 of the testing device 300, and is supplied with the signal SQ from the buffer circuit 160 inside the circuit device 500. The PLL circuit 320 outputs the testing data PLD to the testing data register 44, and the testing data register 44 stores the testing data PLD. The testing data register 44 outputs the testing data PLD to the output section 70 during the test. Further, the information processing device 310 reads the testing data PLD from the testing data register 44 via the interface section 170.

As described above, by making the circuit device 500 incorporate the PLL circuit 320, it becomes unnecessary to provide interconnections for inputting the output signal SQ of the circuit device 500 to the PLL circuit 320 to the testing board. Therefore, it becomes sufficient for the testing device only to read the digital data and supply the reference signal RFS, and the configuration of the testing board can dramatically be simplified. For example, in the testing device of the type of mounting a plurality of oscillators on the testing board with the sockets or the like, and performing the test while switching the oscillators, there is a possibility that the number of sockets, which can be disposed on the testing board, can be increased (the testing efficiency is increased).

4. PLL Circuit

Figure 8:
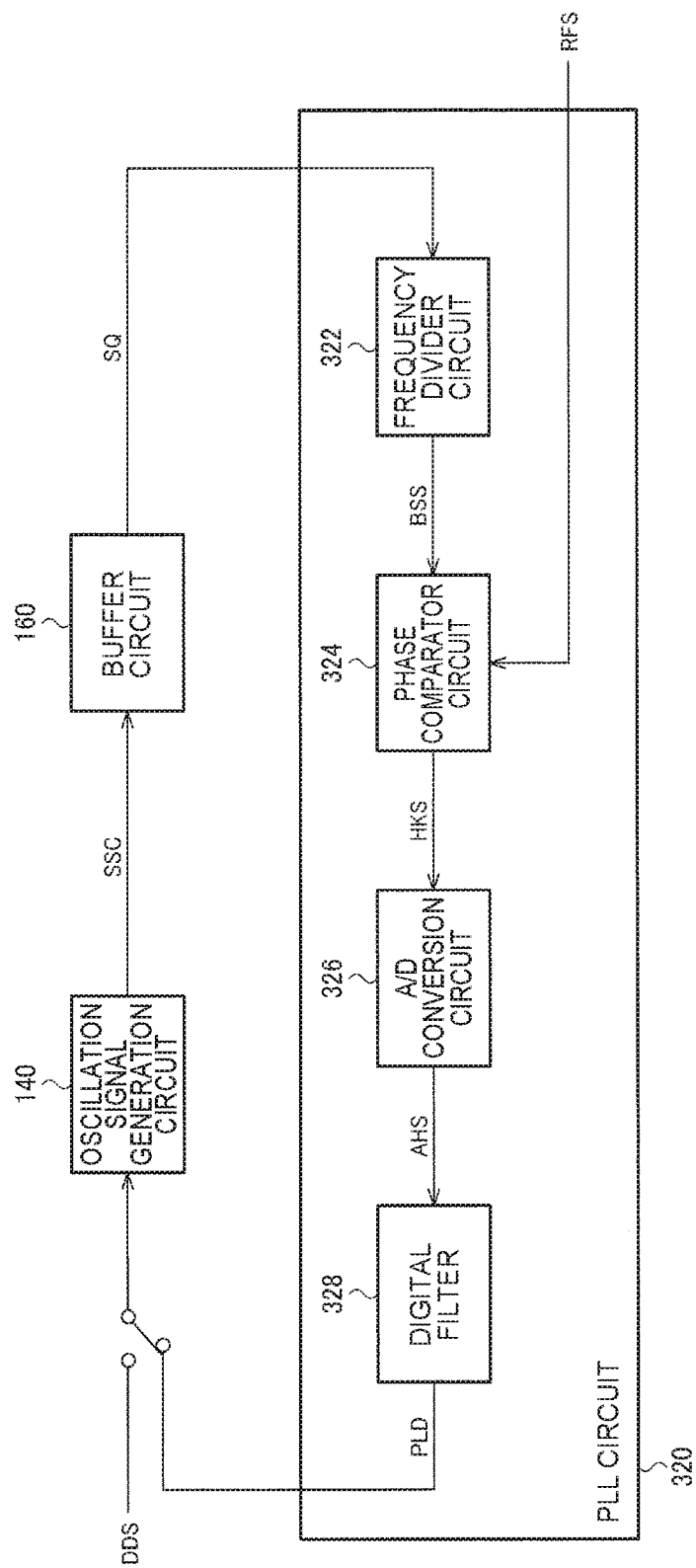
FIG. 8 is a diagram showing a detailed configuration example of a PLL circuit.

FIG. 8 shows a detailed configuration example of the PLL circuit 320. The PLL circuit 320 includes a frequency divider circuit 322, a phase comparator circuit 324, an A/D conversion circuit 326, and a digital filter 328.

The frequency divider circuit 322 divides the frequency of the signal SQ from the buffer circuit 160, and then outputs a signal BSS obtained by dividing the frequency. The division ratio is variably set by, for example, register setting. Defining the multiplication ratio of the PLL circuit 320 as n (n is an integer or a decimal number equal to or greater than 1), the division ratio is expressed as 1/n.

The phase comparator circuit 324 detects the phase difference between the signal BSS and the reference signal RFS, and then outputs a signal HKS based on the phase difference. The signal HKS is, for example, a pulse signal having a pulse width proportional to the phase difference, or a signal having a current level or a voltage level proportional to the phase difference. The phase comparator circuit 324 can be formed of, for example, a charge pump circuit.

The A/D conversion circuit 326 performs the A/D conversion on the signal HKS to obtain data AHS, and then outputs the data AHS thus converted. As the A/D conversion circuit 326, a variety of types (e.g., a parallel comparison type, a pipeline type, a successive-approximation type, and a delta-sigma type) can be adopted.

The digital filter 328 is a digital filter having, for example, a low-pass filter characteristic, and smoothes the data AHS, and then outputs the data thus smoothed as the testing data PLD.

It should be noted that the configuration of the PLL circuit 320 is not limited to the above, but the PLL circuit 320 can also be constituted by, for example, a frequency divider circuit for dividing the frequency of the signal SQ, a phase comparator circuit for performing the phase comparison between the output signal of the frequency divider circuit and the reference signal RFS, an analog loop filter for performing a filter treatment on the output signal of the phase comparator circuit, and an A/D conversion circuit for performing the A/D conversion on the output signal of the analog loop filter.

5. Manufacturing Method

FIG. 9 shows a flowchart of a method (a method of manufacturing the oscillator) of adjusting the temperature characteristic of the oscillator.

Firstly, the ambient temperature of the oscillator is set (S1) to a first temperature point. For example, in the case of controlling the temperature of the testing board to which the oscillator is attached using a thermostatic oven, the temperature of the thermostatic oven is controlled. Alternatively, in the case in which the oscillator sequentially moves a plurality of stages to perform the measurement at one temperature point by one stage, the oscillator is set to the temperature determined in the stage using, for example, a Peltier element incorporated in the stage.

Then, the temperature detection data DTD and the output data PLD of the PLL circuit 320 are recorded (S2). Then, whether or not the measurement has been performed at all of the temperature points to measure is determined (S3). In the case in which there is a temperature point at which the measurement has not been performed, the ambient temperature is set to the next temperature point in the step S1. In the case in which the measurement has been completed at all of the temperature points, the coefficients of the approximation function are calculated (S4) based on the temperature detection data DTD and the output data PLD of the PLL circuit 320 having been recorded at those temperature points. Then, the coefficient data is written (S5) into the storage section 180, and the test is terminated.

In the case of the test system using the thermostatic oven, the temperature is set in the step S1, and then the data recording in the step S2 is performed with respect to a plurality of oscillators (attached to the testing board) as the test target at that temperature. This process is repeated at all of the temperature points, and then the coefficients of each of the oscillators are calculated in the step S4, and then the coefficient data is written into the storage section 180 of each of the oscillators in the step S5.

In the case of the test system using a stage, the stage is moved in the step S1, and the temperature in the stage is set, and then the data recording in the step S2 is performed with respect to a plurality of oscillators (located on the stage) as the test target at that temperature. This process is repeated at all of the temperature points while moving the stage, and then the oscillators are moved to the next stage, and the coefficients of each of the oscillators are calculated in the step S4, and then the coefficient data is written into the storage section 180 of each of the oscillators in the step S5.

FIG. 10 shows a flowchart of a method (a method of manufacturing the oscillator) of testing the temperature characteristic of the oscillator. The test is performed after the test shown in FIG. 9 has been completed.

Firstly, the ambient temperature of the oscillator is set (S21) to the first temperature point. Then, the frequency control data DDS (the operation result data CQ) is recorded (S22). Then, the frequency of the reference signal RFS is set (S23) to the upper limit of the frequency tolerance of the normal oscillation frequency. Then, the output data PLD of the PLL circuit 320 is recorded (S24) as the data PLDU. Then, the frequency of the reference signal RFS is set (S25) to the lower limit of the frequency tolerance of the normal oscillation frequency. Then, the output data PLD of the PLL circuit 320 is recorded (S26) as the data PLDD.

Then, whether or not PLDU≥PLDD is true is determined (S27). In the case in which PLDU≥PLDD is true, whether or not PLDU≥DDS≥PLDD is true is determined (S28). In the case in which PLDU≥PLDD is not true, whether or not PLDU≤DDS≤PLDD is true is determined (S29). In the case in which it is determined in the step S28 that PLDU≥DDS≥PLDD is true, and in the case in which it is determined in the step S29 that PLDU≤DDS≤PLDD is true, whether or not the measurement has been performed at all of the temperature points to measure is determined (S30). In the case in which there is a temperature point at which the measurement has not been performed, the ambient temperature is set to the next temperature point in the step S21. In the case in which the measurement has been performed at all of the temperature points, it is determined that the test target has passed the test (S31), and the test is terminated. In the case in which it is determined in the step S28 that PLDU≥DDS≥PLDD is not true, and in the case in which it is determined in the step S29 that PLDU≤DDS≤PLDD is not true, it is determined that the test target has failed the test (S32), and the test is terminated.

In the test procedure described above, in the case in which the test target fails to satisfy the conditions in the steps S28, S29 once in the measurement at the plurality of temperature points, it is determined that the test target has failed the test, and in the case in which the test target satisfies the conditions in the steps S28, S29 at all of the temperature points, it is determined that the test target has passed the test. Thus, it is possible to guarantee that the frequency deviation is within the frequency tolerance of the normal oscillation frequency in the temperature range in the specification.

6. Third Detailed Configuration of Circuit Device

Figure 11:
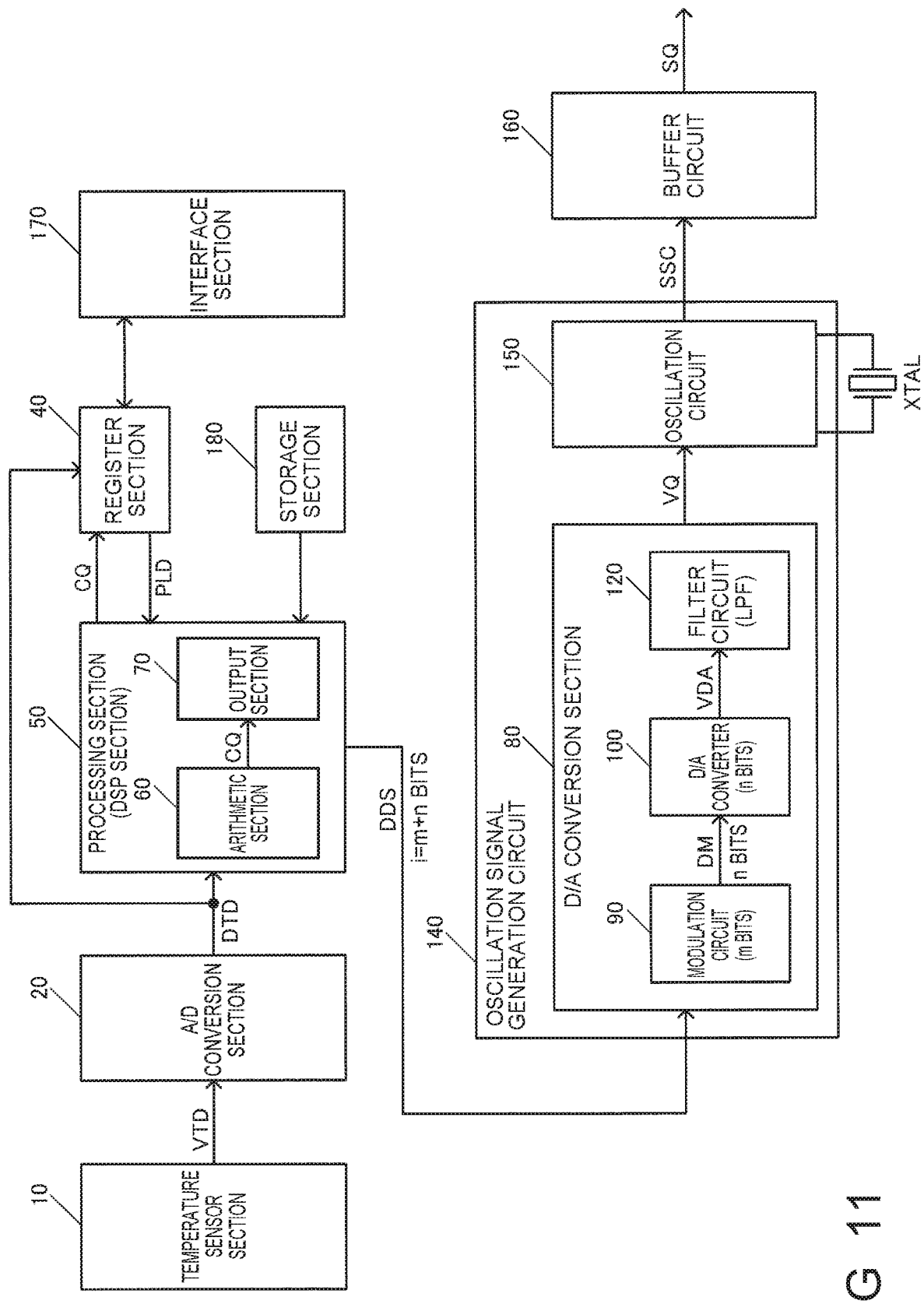
FIG. 11 is a diagram showing a third detailed configuration example of the circuit device.

FIG. 11 shows a third detailed configuration example of the circuit device 500. In FIG. 11, the D/A conversion section 80 includes a modulation circuit 90, a D/A converter 100, and a filter circuit 120.

The modulation circuit 90 of the D/A conversion section 80 receives the i=(n+m) bit frequency control data DDS from the processing section 50 (i, n, and m are each an integer equal to or greater than 1). As an example, i=20, n=16, and m=4 are set. Then, the modulation circuit 90 modulates the n-bit (e.g., 16 bits) data of the frequency control data DDS based on the m-bit (e.g., 4 bits) data of the frequency control data DDS. Specifically, the modulation circuit 90 performs a PWM modulation of the frequency control data DDS. It should be noted that the modulation method of the modulation circuit 90 is not limited to the PWM modulation (the pulse width modulation), but can also be a pulse modulation such as a PDM modulation (a pulse density modulation), and can also be a modulation method other than the pulse modulation. For example, it is also possible to realize bit extension (extension from the n bits to the i bits) by performing an m-bit dither process (dithering process) on the n-bit data of the frequency control data DDS.

The D/A converter 100 performs the D/A conversion of the n-bit data having been modulated by the modulation circuit 90. For example, the D/A converter 100 performs the D/A conversion of the n-bit data (n=16). As the D/A conversion method of the D/A converter 100, there can be adopted, for example, a resistance string type, or a resistance ladder type.

The filter circuit 120 smoothes an output voltage VDA of the D/A converter 100. The filter circuit 120 performs, for example, a low-pass filter treatment to smooth the output voltage VDA. By providing such a filter circuit 120, a PWM demodulation of the signal having been modulated with the PWM modulation becomes possible. The cutoff frequency of the filter circuit 120 can be set in accordance with the frequency of the PWM modulation of the modulation circuit 90. Specifically, since the signal with the output voltage VDA from the D/A converter 100 includes a ripple of the fundamental frequency of the PWM modulation and the harmonic component, the ripple is attenuated by the filter circuit 120. It should be noted that as the filter circuit 120, it is possible to adopt a passive filter using passive elements such as resistors or capacitors. It should be noted that it is also possible to use an active filter such as an SCF as the filter circuit 120.

In the case in which the temperature has changed from a first temperature to a second temperature, the processing section 50 outputs the frequency control data DDS, which changes from the first data corresponding to the first temperature (first temperature detection data) to the second data corresponding to the second temperature (second temperature detection data) by k×LSB (changes by k×LSB at a time). Here, is fulfilled, and k is an integer equal to or greater than 1. For example, in the case of assuming the number of bits (the resolution of the D/A conversion section) of the frequency control data DDS as i, $k<2^i$ is true, and k is an integer sufficiently smaller than $2^i$ (e.g., k=1 through 8). More specifically, $k<2^m$ is fulfilled. In the case of, for example, k=1, the processing section 50 outputs the frequency control data DDS, which changes from the first data to the second data by 1 LSB (by 1 bit). Specifically, the processing section 50 outputs the frequency control data DDS, which changes from the first data toward the second data while being shifted by 1 LSB (1 bit) at a time. It should be noted that the changing step width of the frequency control data DDS is not limited to 1 LSB, but can also be the changing step width equal to or greater than 2×LSB such as 2×LSB, 3×LSB, or 4×LSB.

For example, the processing section 50 includes the arithmetic section 60 and the output section 70. The arithmetic section 60 performs an arithmetic operation of the temperature compensation process of the oscillation frequency based on the temperature detection data DTD. The arithmetic section 60 realizes the temperature compensation process with the digital signal processing using, for example, the floating-point operations. The output section 70 receives operation result data CQ from the arithmetic section 60 to output the frequency control data DDS. Further, in the case in which the operation result data CQ has changed from the first data corresponding the first temperature to the second data corresponding to the second temperature, the output section 70 performs an output process of the frequency control data DDS, which changes from the first data to the second data by k×LSB.

As described above, if the frequency control data DDS output from the processing section 50 becomes to change by k×LSB, it is possible to prevent the situation in which a large voltage change occurs in the output voltage VQ of the D/A conversion section 80 in the case in which, for example, the temperature changes from the first temperature to the second temperature, and due to the voltage change, the frequency hopping (a rapid change in the oscillation frequency) occurs.

More specifically, the processing section 50 compares the first data, which is the operation result data (CQ) of the temperature compensation process in the previous operation (at the previous timing), and the second data, which is the operation result data of the temperature compensation process in the present operation (at the present timing), with each other.

Then, in the case in which the second data is higher than the first data, the processing section 50 (the output section 70) performs a process of adding a predetermined value to the first data. The processing section 50 performs, for example, the process of adding k×LSB as the predetermined value. In the case of, for example, k=1, the processing section 50 performs the process of adding 1 LSB as the predetermined value. It should be noted that the predetermined value to be added is not limited to 1 LSB, but can also be equal to or more than 2×LSB. Then, while performing, for example, the addition process until addition result data reaches the second data, the processing section 50 outputs the addition result data as the frequency control data DDS.

On the other hand, in the case in which the second data corresponding to the second temperature is lower than the first data corresponding to the first temperature, the processing section 50 (the output section 70) performs a process of subtracting a predetermined value from the first data. The processing section 50 performs, for example, the process of subtracting k×LSB as the predetermined value. In the case of, for example, k=1, the processing section 50 performs the process of subtracting 1 LSB as the predetermined value. It should be noted that the predetermined value to be subtracted is not limited to 1 LSB, but can also be equal to or more than 2×LSB. Then, while performing, for example, the subtraction process until subtraction result data reaches the second data, the processing section 50 outputs the subtraction result data as the frequency control data DDS.

7. Processing Section

Figure 12:
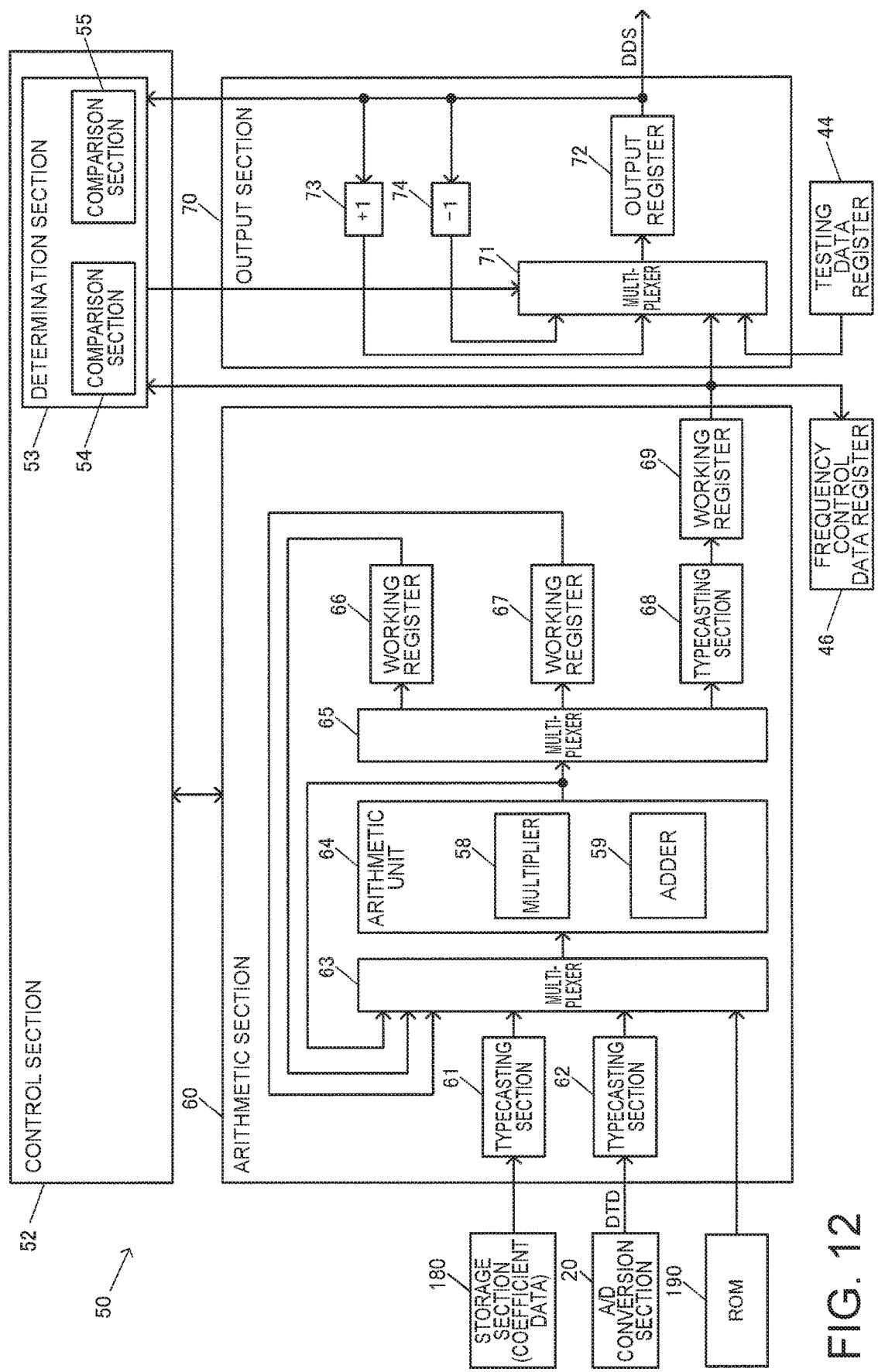
FIG. 12 is a detailed configuration example of a processing section.

FIG. 12 shows a detailed configuration example of the processing section 50. The processing section 50 (a DSP section) includes a control section 52, the arithmetic section 60, and the output section 70.

The control section 52 performs the control of the arithmetic section 60 and the output section 70, and a variety of types of determination processing. The arithmetic section performs an arithmetic operation of the temperature compensation process of the oscillation frequency based on the temperature detection data DTD from the A/D conversion section 20. The output section 70 receives operation result data from the arithmetic section 60 to output the frequency control data DDS.

The control section 52 includes a determination section 53. The determination section 53 has comparison sections 54, 55, and performs a variety of types of determination processing based on the comparison results in the comparison sections 54, 55.

The arithmetic section 60 includes typecasting sections 61, 62, and 68, multiplexers 63, 65, an arithmetic unit 64, and working registers 66, 67, and 69. The arithmetic unit 64 includes a multiplier 58 and an adder 59.

The coefficient data from the storage section 180 is input to the typecasting section 61, and the typecasting section 61 performs the typecast from the binary type (integer) to the floating-point type (single precision), and then outputs the coefficient data thus typecast to the multiplexer 63. The temperature detection data DTD from the A/D conversion section 20 is input to the typecasting section 62, and the typecasting section 62 performs the typecast from the binary type to the floating-point type, and then outputs the temperature detection data DTD thus typecast to the multiplexer 63. For example, the typecasting section 62 typecasts the temperature detection data DTD as, for example, 15-bit binary data into 32-bit floating-point data (the exponent part: 8 bits, the mantissa part: 23 bits, and the sign: 1 bit). Further, constant data as a fixed value for the temperature compensation process is input from a ROM 190 for storing the constant data to the multiplexer 63.

The multiplexer 63 selects either one of output data of the arithmetic unit 64, output data of the working registers 66, 67, output data of the typecasting sections 61, 62, and output data of the ROM 190, and then outputs the result to the arithmetic unit 64. The arithmetic unit 64 performs arithmetic processing such as 32-bit floating-point product-sum operation with the multiplier 58 and the adder 59 to thereby perform the temperature compensation process. The multiplexer 65 selects either one of output data of the multiplier 58 of the arithmetic unit 64 and output data of the adder 59 of the arithmetic unit 64, and then outputs the result to either of the working registers 66, 67 and the typecasting section 68. The typecasting section 68 typecasts the operation result data of the arithmetic section 60 (the arithmetic unit 64) from the floating-point type to the binary type. For example, the typecasting section 68 typecasts the 32-bit floating-pint operation result data into the 20-bit binary operation result data. The operation result data thus typecast is held in the working register 69.

The arithmetic section 60 (the arithmetic unit 64) performs the temperature compensation process for approximating the temperature characteristic curve by, for example, a quintic approximation function (polynomial) as shown in Formula (1) below.

$$Vcp = b \cdot (T-T0)^5 + c \cdot (T-T0)^4 + d \cdot (T-T0)^3 + e \cdot (T-T0) \qquad (1)$$

In Formula (1) described above, T corresponds to the temperature represented by the temperature detection data DTD, and T0 corresponds to a reference temperature (e.g., 25° C.). The characters b, c, d, and e are coefficients of the approximation function, and the data of the coefficients is stored in the storage section 180. The arithmetic unit 64 executes the arithmetic processing such as the product-sum operation of Formula (1) described above.

The output section 70 includes a multiplexer 71, an output register 72, an LSB adder 73, and an LSB subtractor 74. The multiplexer 71 selects either one of the operation result data as the output data of the arithmetic section 60, output data of the LSB adder 73, and output data of the LSB subtractor 74, and then outputs the result to the output register 72. The determination section 53 of the control section 52 monitors the output data of the working register 69 and the output data of the output register 72. Then, the determination section 53 performs a variety of comparative determinations using the comparison sections 54, 55, and controls the multiplexer 71 based on the determination result.

Figure 13A:
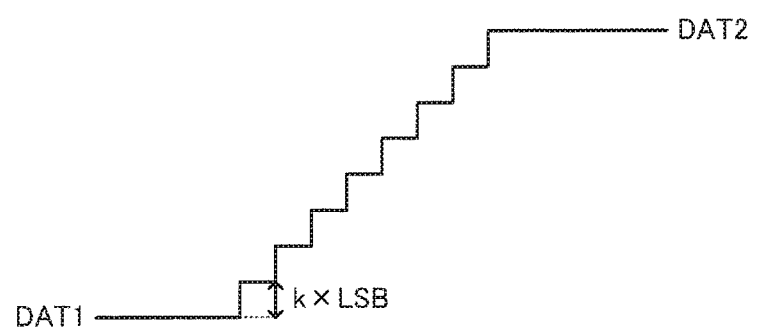
FIGS. 13A and 13B are explanatory diagrams of a method of changing the frequency control data by k×LSB.
Figure 13B:
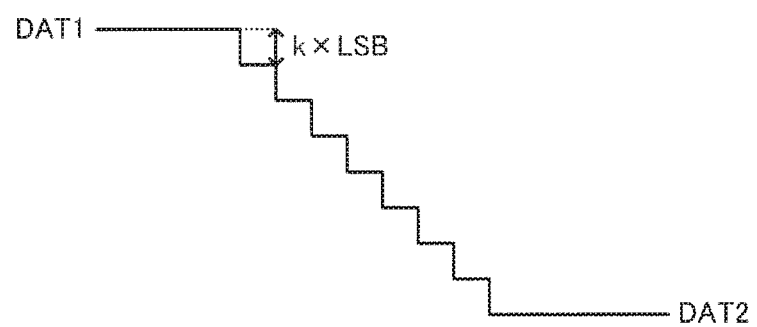

In the present embodiment, as shown in FIG. 13A and FIG. 13B, the output section 70 outputs the frequency control data DDS, which changes from the first data DAT1 corresponding to the first temperature to the second data DAT2 corresponding to the second temperature by k×LSB, in the case in which the temperature has changed from the first temperature to the second temperature. For example, k=1 is assumed, and the output section 70 outputs the frequency control data DDS changing by 1 LSB.

For example, the output register 72 stores the first data DAT1, which is the operation result data of the arithmetic section 60 in the previous operation (n−1-th timing). The working register 69 stores the second data DAT2, which is the operation result data of the arithmetic section 60 in the present operation ($n^{th}$ timing).

Further, as shown in FIG. 13A, in the case in which the second data DAT2 as the operation result data of the present operation is larger than the first data DAT1 as the operation result of the previous operation, the output section 70 performs a process of adding 1 LSB (k×LSB in a broad sense) as the predetermined value to the first data DAT1 until the addition result data reaches the second data DAT2, and at the same time outputs the addition result data as the frequency control data DDS during the addition process.

In contrast, as shown in FIG. 13B, in the case in which the second data DAT2 as the operation result data of the present operation is smaller than the first data DAT1 as the operation result of the previous operation, the output section 70 performs a process of subtracting 1 LSB (k×LSB) as the predetermined value from the first data DAT1 until the subtraction result data reaches the second data DAT2, and at the same time outputs the subtraction result data as the frequency control data DDS during the subtraction process.

Specifically, the determination section 53 of the control section 52 compares the first data DAT1 stored in the output register 72 and the second data DAT2 stored in the working register 69 with each other. The determination of the comparison is performed by the comparison section 54.

Then, in the case in which the second data DAT2 is larger than the first data DAT1 as shown in FIG. 13A, the process of adding 1 LSB to the first data DAT1 of the output register 72 is performed by the LSB adder 73, and the output data of the LSB adder 73 is selected by the multiplexer 71. Thus, the addition result data, which is obtained by sequentially adding 1 LSB to the first data DAT1 as shown in FIG. 13A, is held in the output register 72. Then, it becomes that the addition result data, which is updated by sequentially adding 1 LSB, is output as the frequency control data DDS. Then, the addition process described above is repeated until the addition result data reaches the second data DAT2. The comparison process for determining matching between the addition result data and the second data DAT2 is performed by the comparison section 55.

In contrast, in the case in which the second data DAT2 is smaller than the first data DAT1 as shown in FIG. 13B, the process of subtracting 1 LSB from the first data DAT1 of the output register 72 is performed by the LSB subtractor 74, and the output data of the LSB subtractor 74 is selected by the multiplexer 71. Thus, the subtraction result data, which is obtained by sequentially subtracting 1 LSB from the first data DAT1 as shown in FIG. 13B, is held in the output register 72. Then, it becomes that the subtraction result data, which is updated by sequentially subtracting 1 LSB, is output as the frequency control data DDS. Then, the subtraction process described above is repeated until the subtraction result data reaches the second data DAT2.

It should be noted that the maximum number of times of the addition process or the subtraction process by the LSB adder 73 or the LSB subtractor 74 is set to a predetermined number of times (e.g., 8 times). Further, for example, the maximum temperature change of the ambient temperature can be regulated (e.g., 2.8° C./10 sec). Therefore, there is adopted the configuration in which the temperature change (e.g., the temperature change corresponding to the voltage of 1 LSB×8 times) corresponding to, for example, 1 LSB multiplied by the predetermined number of times sufficiently exceeds the maximum temperature change described above.

Further, the output rate of the frequency control data DDS of the processing section 50 is higher than the output rate of the temperature detection data of the A/D conversion section 20. Therefore, for example, in the period from when the temperature detection data DTD2 is input from the A/D conversion section 20 to the processing section 50, to when the next temperature detection data DTD3 is input, the process of adding or subtracting 1 LSB a predetermined times as shown in FIGS. 13A and 13B can be performed. For example, the addition process and the subtraction process can be executed a predetermined times (e.g., 8 times), which is the maximum number of times described above.

Hereinabove, the operation during the normal operation is described. The period of the normal operation (the normal operation mode) and the period of the test (the test mode) are controlled by, for example, register setting or terminal setting. An operation during the test will hereinafter be described.

During the test, the arithmetic section 60 operates similarly to the operation performed during the normal operation. Further, the operation result data held in the working register 69 is held in the frequency control data register 46, and is read by the information processing device 310 of the testing device 300. Further, to the multiplexer 71 of the output section 70, there is input the testing data PLD stored in the testing data register 44. During the test, the multiplexer 71 selects the testing data PLD, the testing data PLD is stored in the output register 72, and is output as the frequency control data DDS. Due to such an operation as described above, the test shown in FIG. 9 and FIG. 10 can be realized.

8. A/D Conversion Section

Figure 14:
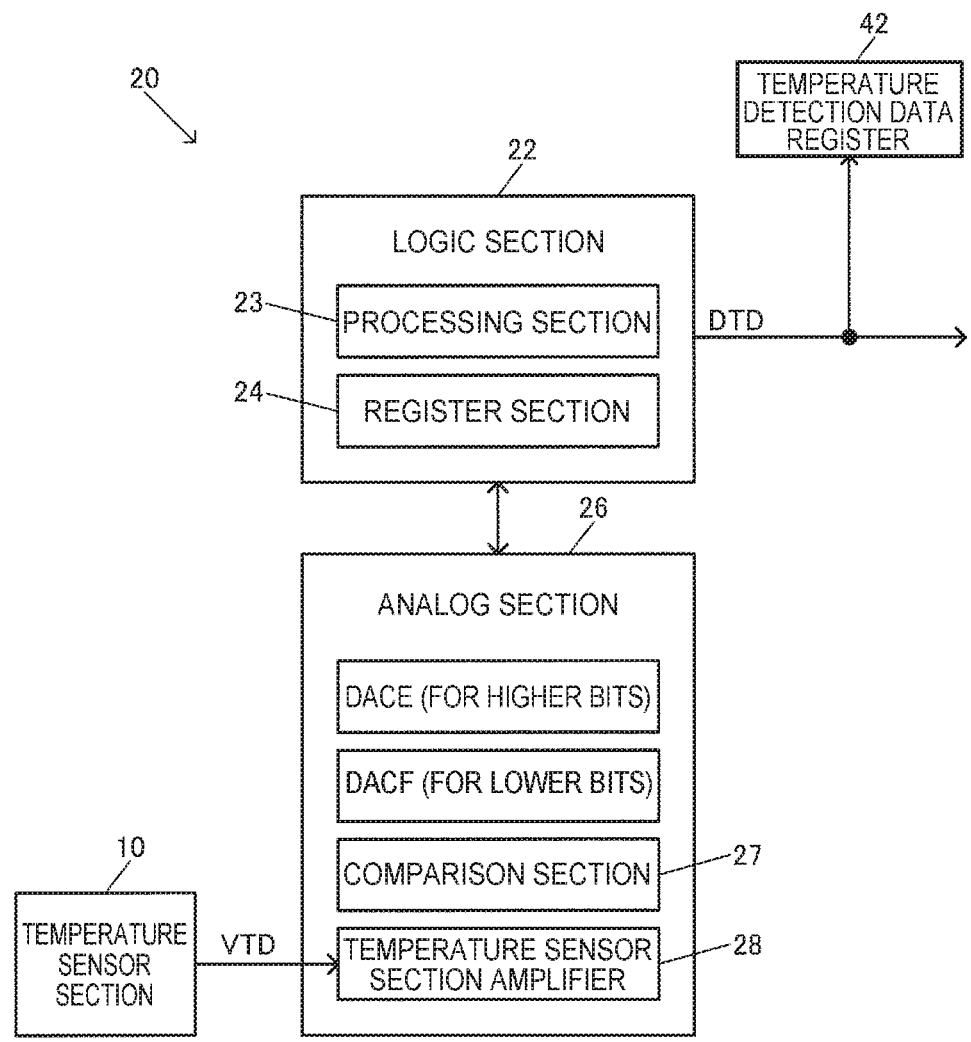
FIG. 14 is a diagram showing a detailed configuration example of an A/D conversion section.

FIG. 14 shows a detailed configuration example of the A/D conversion section 20. The A/D conversion section 20 includes a processing section 23, a register section 24, D/A converters DACE, DACF, and a comparison section 27. Further, the A/D conversion section 20 can also include a temperature sensor section amplifier 28. The processing section 23 and the register section 24 are disposed as a logic section 22, and the D/A converters DACE, DACF, the comparison section 27, and the temperature sensor section amplifier 28 are disposed as an analog section 26.

The register section 24 stores result data such as an interim result or a final result of the A/D conversion. The register section 24 corresponds to, for example, a successive approximation result register in the successive approximation system. The D/A converters DACE, DACF perform the D/A conversion on the result data in the register section 24. The comparison section 27 performs the comparison between the output voltages of the D/A converters DACE, DACF and the temperature detection voltage VTD (the voltage amplified by the temperature sensor section amplifier 28). The comparison section 27 can be realized using, for example, a chopper comparator. The processing section 23 performs a determination process based on the comparison result of the comparison section 27, and then performs an update process of the result data in the register section 24. Then, the final temperature detection data DTD obtained by the update process is output from the A/D conversion section 20 as an A/D conversion result of the temperature detection voltage VTD. According to such a configuration, it is possible to realize the A/D conversion using, for example, the successive approximation, an A/D conversion using a method similar to the successive approximation, and so on.

In the present embodiment, as described above, the final temperature detection data DTD obtained by the update process is stored in the temperature detection data register 42. Further, during the test, the information processing device 310 of the testing device 300 reads the temperature detection data DTD from the temperature detection data register 42. Due to such an operation as described above, the test shown in FIG. 9 can be realized.

9. Modified Configuration Example of Circuit Device

Figure 15:
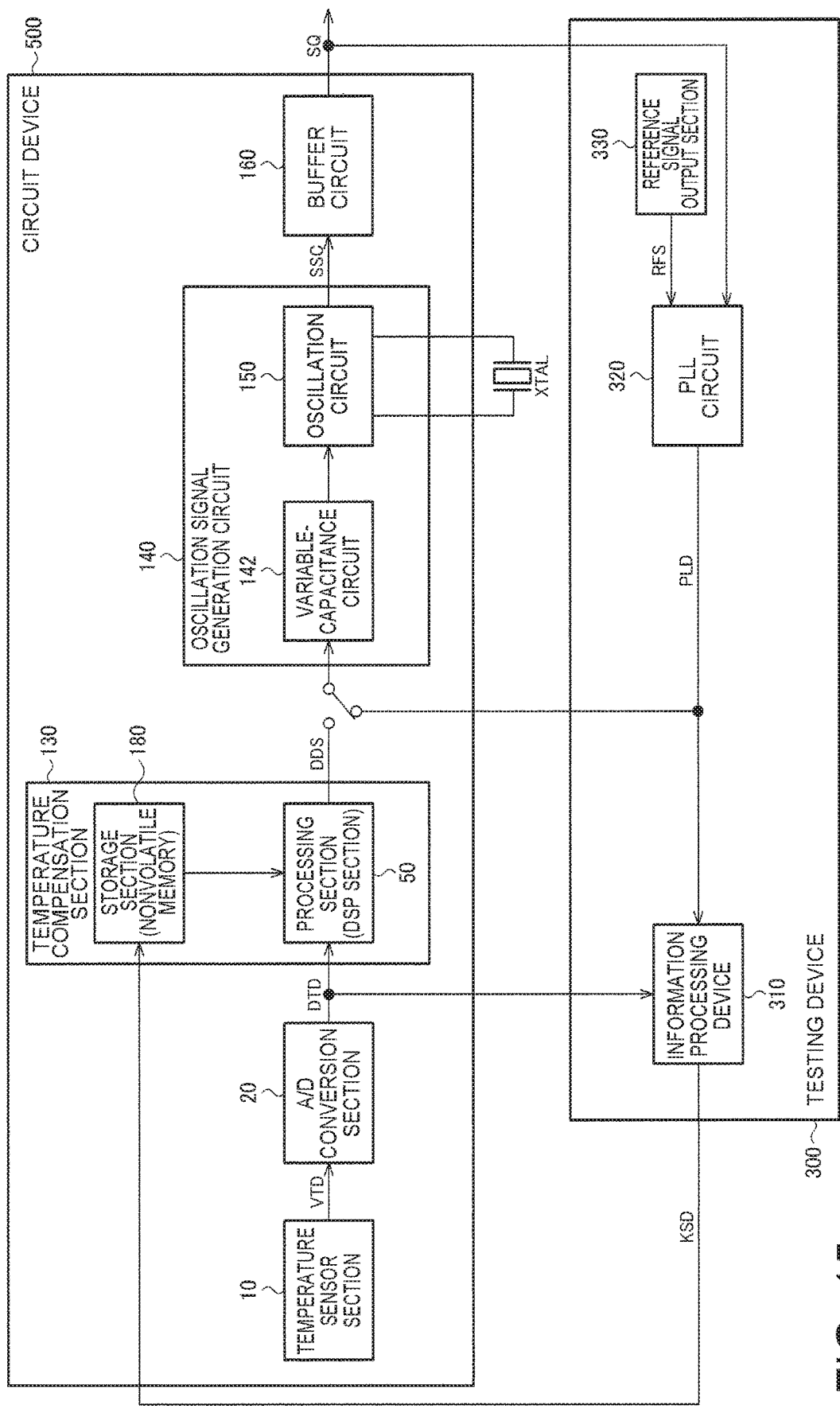
FIG. 15 is a modified configuration example of the circuit device.

FIG. 15 shows a modified configuration example of the circuit device 500.

In FIG. 15, unlike FIG. 4, FIG. 6, FIG. 7, and FIG. 11, the oscillation signal generation circuit 140 is not provided with the D/A conversion section 80. Further, the oscillation frequency of the oscillation signal SSC generated by the oscillation signal generation circuit 140 is directly controlled based on the frequency control data DDS from the temperature compensation section 130. In other words, the oscillation frequency of the oscillation signal SSC is controlled without intervention of the D/A conversion section.

For example, the oscillation signal generation circuit 140 has a variable-capacitance circuit 142 and the oscillation circuit 150. The oscillation signal generation circuit 140 is not provided with the D/A conversion section 80 shown in FIG. 4, FIG. 6, FIG. 7, and FIG. 11. Further, instead of the variable-capacitance capacitor the capacitor of which is controlled by the output voltage VQ of the D/A conversion section 80, the variable-capacitance circuit 142 is disposed. One end of the variable-capacitance circuit 142 is connected to one end of the resonator XTAL.

The capacitance value of the variable-capacitance circuit 142 is controlled based on the frequency control data DDS from the processing section 50. For example, the variable-capacitance circuit 142 has a plurality of capacitors (a capacitor array), and a plurality of switch elements (a switch array) each controlled to be set to the ON state or the OFF state based on the frequency control data DDS. Each of the switch elements is electrically connected to corresponding one of the capacitors. Further, by setting the switch elements to the ON state or the OFF state, the number of capacitors, one ends of which are connected to the one end of the resonator XTAL out of the plurality of capacitors, varies. Thus, the capacitance value of the variable-capacitance circuit 142 is controlled, and thus, the capacitance value of the one end of the resonator XTAL changes. Therefore, the capacitance value of the variable-capacitance circuit 142 is directly controlled by the frequency control data DDS, and it becomes possible to control the oscillation frequency of the oscillation signal SSC.

10. Oscillator, Electronic Apparatus, and Moving Object

Figure 16A:
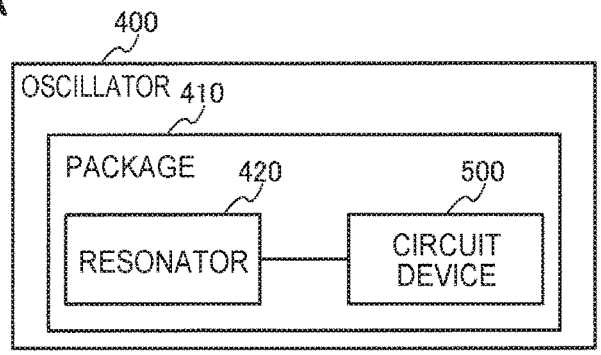
FIG. 16A is a diagram showing a configuration example of the oscillator.

FIG. 16A shows a configuration example of an oscillator 400 including the circuit device 500 according to the present embodiment. As shown in FIG. 16A, the oscillator 400 includes a resonator 420 and the circuit device 500. The resonator 420 and the circuit device 500 are mounted in a package 410 of the oscillator 400. Further, terminals of the resonator 420 and terminals (pads) of the circuit device 500 (IC) are electrically connected respectively to each other with interconnections of the package 410.

Figure 16B:
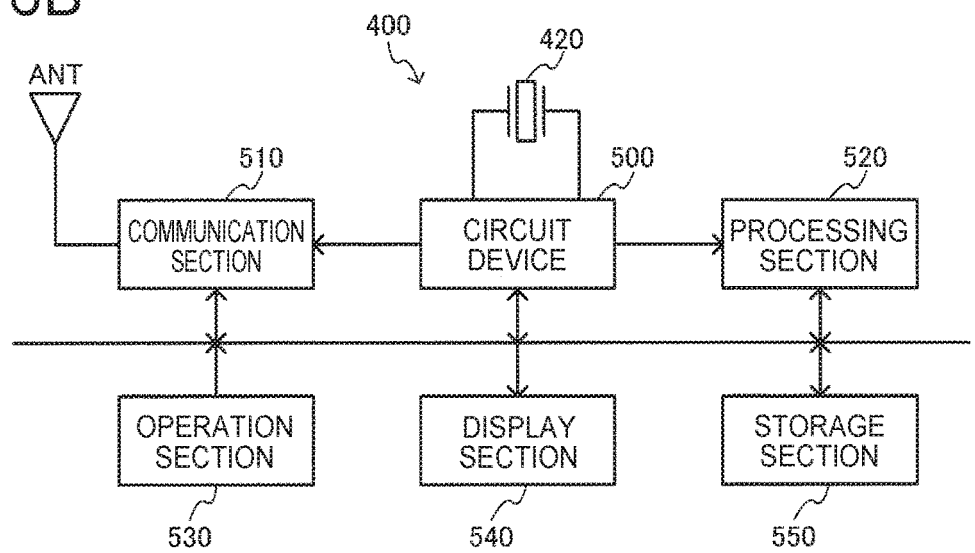
FIG. 16B is a diagram showing a configuration example of an electronic apparatus.

FIG. 16B shows a configuration example of an electronic apparatus including the circuit device 500 according to the present embodiment. The electronic apparatus includes the circuit device 500 according to the present embodiment, the resonator 420 such as a quartz crystal resonator, an antenna ANT, a communication section 510, and a processing section 520. Further, the electronic apparatus can include an operation section 530, a display section 540, and a storage section 550. The resonator 420 and the circuit device 500 constitute the oscillator 400. It should be noted that the electronic apparatus is not limited to the configuration shown in FIG. 16B, but a variety of practical modifications such as elimination of some of the constituents or addition of other constituents can be adopted.

As the electronic apparatus shown in FIG. 16B, there can be assumed a variety of apparatuses such as a wearable apparatus such as a timepiece incorporating GPS, a biological information measurement apparatus (e.g., a sphygmograph or a pedometer), or a head-mounted display device, a portable information terminal (a mobile terminal) such as a smartphone, a cellular phone, a portable video game player, a laptop PC, or a tablet PC, a content supply terminal for delivering contents, a video apparatus such as a digital camera or a video camera, or a network-related apparatus such as a base station, or a router.

The communication section 510 (a wireless circuit) performs a process of receiving data externally via the antenna ANT and transmitting data to the outside. The processing section 520 performs a control process of the electronic apparatus, a variety of types of digital processing of the data transmitted or received via the communication section 510. The function of the processing section 520 can be realized by a processor such as a microcomputer.

The operation section 530 is for allowing the user to perform an input operation, and can be realized by operation buttons, a touch panel display, and so on. The display section 540 is for displaying a variety of types of information, and can be realized by a display using a liquid crystal, an organic EL, and so on. It should be noted that in the case of using the touch panel display as the operation section 530, it results that the touch panel display also functions as the operation section 530 and the display section 540. The storage section 550 is for storing the data, and the function thereof can be realized by a semiconductor memory such as a RAM or a ROM, a hard disk drive (HDD), or the like.

Figure 16C:
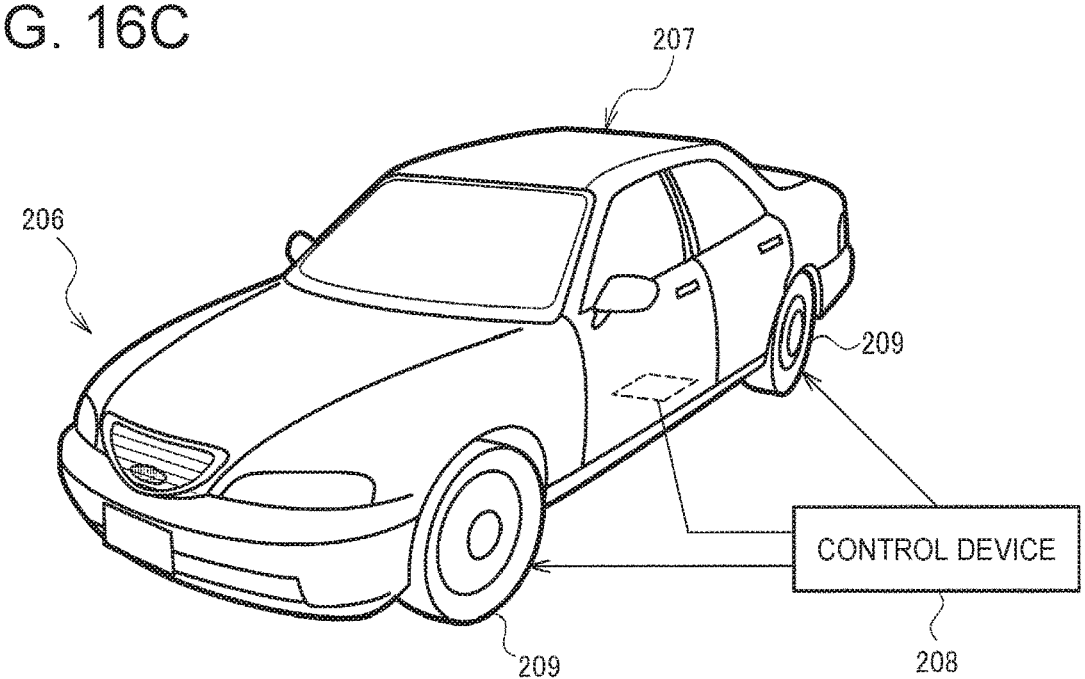
FIG. 16C is a diagram showing an example of a moving object.

FIG. 16C shows an example of a moving object including the circuit device according to the present embodiment. The circuit device (the oscillator) according to the present embodiment can be incorporated in a variety of moving objects such as a vehicle, an airplane, a motorbike, a bicycle, a ship, or a boat. The moving object is equipment or a device, which is provided with a drive mechanism such as an engine or an electric motor, a steering mechanism such as a steering wheel or a helm, and a variety of electronic apparatuses (in-car apparatuses), and moves on the ground, in the air, or on the sea. FIG. 16C schematically shows a vehicle 206 as a specific example of the moving object. The vehicle 206 incorporates an oscillator (not shown) having the circuit device according to the present embodiment and a resonator. A control device 208 operates with the clock signal generated by the oscillator. The control device 208 controls the stiffness of the suspension, and controls the brake of each of the wheels 209 in accordance with, for example, the attitude of a vehicle body 207. For example, it is also possible to realize automated driving of the vehicle 206 using the control device 208. It should be noted that the apparatus incorporating the circuit device or the oscillator according to the present embodiment is not limited to such a control device 208, but the circuit device or the oscillator according to the present embodiment can be incorporated in a variety of apparatuses provided to a moving object such as the vehicle 206.

It should be noted that although the present embodiment is hereinabove explained in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the invention. Further, the configurations and the operations of the circuit device, the testing device, the testing system, the oscillator, the electronic apparatus, and the moving object are not limited to those described in the present embodiment, but can be implemented with a variety of modifications.

The entire disclosure of Japanese Patent Application No. 2015-232844, filed Nov. 30, 2015 is expressly incorporated by reference herein.

What is claimed is:

1. A circuit device comprising:
    an A/D conversion section adapted to perform an A/D conversion of a temperature detection voltage from a temperature sensor section to output temperature detection data;
    a temperature compensation section adapted to perform a temperature compensation process of an oscillation frequency based on the temperature detection data to output frequency control data of the oscillation frequency;
    an oscillation signal generation circuit adapted to generate an oscillation signal with the oscillation frequency set by the frequency control data using the frequency control data from the temperature compensation section and a resonator; and
    a switch connected between the oscillation signal generation circuit and the temperature compensation section that when switched to a first state connects the oscillation signal generation circuit to the temperature compensation section and when switched to a second state connects the oscillation signal generation circuit to a PLL circuit,
    wherein the frequency control data from the temperature compensation section is input to the oscillation signal generation circuit during a normal operation in which the switch is switched to the first state,
    wherein during a period other than the normal operation in which the switch is switched to the second state, data generated by the PLL circuit adapted to compare an input signal based on an output signal of the oscillation signal generation circuit and a reference signal with each other is input to the oscillation signal generation circuit as oscillation signal generation circuit input data,
    wherein the oscillation signal generation circuit includes
        a D/A conversion section adapted to perform a D/A conversion of the frequency control data from the temperature compensation section, and
        an oscillation circuit adapted to generate the oscillation signal using an output voltage of the D/A conversion section and the resonator,
    wherein the frequency control data from the temperature compensation section is input to the D/A conversion section during the normal operation,
    wherein, during the period other than the normal operation, the oscillation signal generation circuit input data is input to the D/A conversion section, and
    wherein the PLL circuit includes
        a phase comparator circuit adapted to compare the input signal based on the output signal of the oscillation signal generation circuit and the reference signal with each other,
        an A/D conversion circuit adapted to perform an A/D conversion on an output signal of the phase comparator circuit, and
        a digital filter adapted to perform a filter treatment on output data of the A/D conversion circuit to output the oscillation signal generation circuit input data.

2. The circuit device according to claim 1, further comprising:
    an interface section,
    wherein the oscillation signal generation circuit input data is data input from the PLL circuit disposed outside the circuit device via the interface section.

3. The circuit device according to claim 1, wherein
    the PLL circuit is a testing PLL circuit disposed inside the circuit device.

4. The circuit device according to claim 1, wherein
    during the normal operation, the temperature compensation section outputs the frequency control data, which changes from first data corresponding to a first temperature to second data corresponding to a second temperature by k×LSB (k≥1), to the oscillation signal generation circuit in a case in which the temperature has changed from the first temperature to the second temperature, and
    during a test as the period other than the normal operation, the oscillation signal generation circuit input data is input to the oscillation signal generation circuit.

5. The circuit device according to claim 1, wherein
    the reference signal corresponding to a normal oscillation frequency is input to the PLL circuit.

6. The circuit device according to claim 1, wherein
    a first reference signal corresponding to an upper limit of a frequency tolerance of a normal oscillation frequency, and a second reference signal corresponding to a lower limit of the frequency tolerance are input to the PLL circuit, and
    the oscillation signal generation circuit input data corresponding to the first reference signal and the oscillation signal generation circuit input data corresponding to the second reference signal are input to the oscillation signal generation circuit.

7. An oscillator comprising:
The circuit device according to claim 1; and
the resonator.

8. An oscillator comprising:
the circuit device according to claim 2; and
the resonator.

9. An oscillator comprising:
the circuit device according to claim 3; and
the resonator.

10. An electronic apparatus comprising:
the circuit device according to claim 1.

11. An electronic apparatus comprising:
the circuit device according to claim 2.

12. An electronic apparatus comprising:
the circuit device according to claim 3.

13. A moving object comprising:
the circuit device according to claim 1.

14. A moving object comprising:
the circuit device according to claim 2.

15. A moving object comprising:
the circuit device according to claim 3.

16. A method of manufacturing an oscillator, comprising:
inputting an input signal based on an output signal of an oscillation signal generation circuit of the oscillator and a first reference signal corresponding to an upper limit of a frequency tolerance of a normal oscillation frequency to a PLL circuit;
inputting data generated by the PLL circuit to the oscillation signal generation circuit as first oscillation signal generation circuit input data;
inputting the input signal based on the output signal of the oscillation signal generation circuit and a second reference signal corresponding to a lower limit of the frequency tolerance of the normal oscillation frequency to the PLL circuit;
inputting data generated by the PLL circuit to the oscillation signal generation circuit as second oscillation signal generation circuit input data;
comparing the first oscillation signal generation circuit input data, the second oscillation signal generation circuit input data, and frequency control data from a temperature compensation section of the oscillator with each other; and
determining whether or not oscillation frequency of the oscillator satisfies the frequency tolerance of the normal oscillation frequency based on a result of the comparison.

17. A circuit device comprising:
an A/D conversion section adapted to perform an A/D conversion of a temperature detection voltage from a temperature sensor section to output temperature detection data;
a temperature compensation section adapted to perform a temperature compensation process of an oscillation frequency based on the temperature detection data to output frequency control data of the oscillation frequency;
an oscillation signal generation circuit adapted to generate an oscillation signal with the oscillation frequency set by the frequency control data using the frequency control data from the temperature compensation section and a resonator; and
a switch connected between the oscillation signal generation circuit and the temperature compensation section that when switched to a first state connects the oscillation signal generation circuit to the temperature compensation section and when switched to a second state connects the oscillation signal generation circuit to a PLL circuit,
wherein the frequency control data from the temperature compensation section is input to the oscillation signal generation circuit during a normal operation in which the switch is switched to the first state,
wherein during a period other than the normal operation in which the switch is switched to the second state, data generated by the PLL circuit adapted to compare an input signal based on an output signal of the oscillation signal generation circuit and a reference signal with each other is input to the oscillation signal generation circuit as oscillation signal generation circuit input data,
wherein the oscillation signal generation circuit includes
a D/A conversion section adapted to perform a D/A conversion of the frequency control data from the temperature compensation section, and
an oscillation circuit adapted to generate the oscillation signal using an output voltage of the D/A conversion section and the resonator,
wherein the frequency control data from the temperature compensation section is input to the D/A conversion section during the normal operation,
wherein, during the period other than the normal operation, the oscillation signal generation circuit input data is input to the D/A conversion section,
wherein a first reference signal corresponding to an upper limit of a frequency tolerance of a normal oscillation frequency, and a second reference signal corresponding to a lower limit of the frequency tolerance are input to the PLL circuit, and
wherein the oscillation signal generation circuit input data corresponding to the first reference signal and the oscillation signal generation circuit input data corresponding to the second reference signal are input to the oscillation signal generation circuit.

* * * * *